United States Patent
Murakami et al.

(10) Patent No.: US 11,314,167 B2
(45) Date of Patent: Apr. 26, 2022

(54) IMPRINT APPARATUS, IMPRINT METHOD, AND METHOD FOR MANUFACTURING ARTICLE

(71) Applicant: CANON KABUSHIKI KAISHA, Tokyo (JP)

(72) Inventors: Yosuke Murakami, Utsunomiya (JP); Zenichi Hamaya, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 430 days.

(21) Appl. No.: 16/382,654

(22) Filed: Apr. 12, 2019

(65) Prior Publication Data

US 2019/0317398 A1 Oct. 17, 2019

(30) Foreign Application Priority Data

Apr. 16, 2018 (JP) .............................. JP2018-078578

(51) Int. Cl.
- *B82Y 10/00* (2011.01)
- *G03F 7/00* (2006.01)
- *B82Y 40/00* (2011.01)

(52) U.S. Cl.
CPC .............. *G03F 7/002* (2013.01); *B82Y 10/00* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 7,531,025 B2 | 5/2009 | McMackin et al. | |
| 2016/0214312 A1* | 7/2016 | Hirano | G03F 7/0002 |

FOREIGN PATENT DOCUMENTS

| | | |
|---|---|---|
| JP | 2007509769 A | 4/2007 |
| JP | 2016054231 A | 4/2016 |

OTHER PUBLICATIONS

JP2007509769 English Translation 2007 (Year: 2007).*
Sakamoto, Eiji. JP2016054231 English Translation 2016 (Year: 2016).*

* cited by examiner

*Primary Examiner* — Jacob T Minskey
*Assistant Examiner* — Adrien J Bernard
(74) *Attorney, Agent, or Firm* — Rossi, Kimms & McDowell LLP

(57) ABSTRACT

Provided is an apparatus which is advantageous in view of reduction of consumption of a replacement gas. An apparatus for forming a pattern on a substrate using a mold includes a gas supply unit, a positioning unit and a controller. The controller controls a gas supply unit and a positioning unit and, causes second contact between a second shot region different from a first shot region and the mold after first contact between a first shot region having a material supplied thereon among the plurality of shot regions and the mold and controls the positioning unit so that a second gap which is the distance at the time of changing a relative position between the mold and the substrate in a surface direction from the first shot region to the second shot region is shorter than a first gap which is the distance at the time of gas supply.

14 Claims, 13 Drawing Sheets

IMPRINT APPARATUS, IMPRINT METHOD, AND METHOD FOR MANUFACTURING ARTICLE

BACKGROUND OF THE INVENTION

Field of the Invention

The present invention relates to an imprint apparatus, an imprint method, and a method for manufacturing an article.

Description of the Related Art

The demands for miniaturization of semiconductor apparatuses has progressed and micro-fabrication techniques are attracting attention in which an imprint material on a substrate is formed (molded) with a mold and cured to form a pattern on the substrate in addition to conventional photolithography techniques. Such techniques are referred to as imprint techniques and it is possible to form a fine pattern on the order of several nanometers on a substrate therewith.

As one type of imprint technique, there is a light curing method. An imprint apparatus adopting a light curing method forms a pattern on a substrate by bringing (imprinting) a mold into contact with (on) a photocurable imprint material supplied onto the substrate, irradiating the imprint material with light to cure the imprint material, and separating (releasing) the mold from the cured imprint material.

At the time of imprinting, air (a residual gas) between the mold and the imprinting material may mix into an uncured imprint material as air bubbles, resulting in unfilled defects (pattern defects) in some cases. Thus, in Published Japanese Translation No. 2007-509769 of the PCT International Publication, spaces between a mold and a substrate are filled with a gas having only high solubility, only high diffusibility, or both of these with respect to the imprint material (hereinafter referred to as "a replacement gas"), thereby minimizing the amount of residual air bubbles. Furthermore, the imprint apparatus in Japanese Patent Laid-Open No. 2016-54231 includes a gas supply unit and a gas recovery unit. The gas recovery unit is stopped after imprinting and an amount of replacement gas to be supplied is set to be larger than a volume of the space between the mold and the substrate which increases at the time of mold releasing. Thus, a decrease in concentration of a replacement gas caused by the entry of air from an external space at the time of mold releasing is minimized.

In such an imprint apparatus, when an amount of consumption of replacement gas is large, there is a problem that the economic costs of operating the imprint apparatus are high. In the imprint apparatuses described in Published Japanese Translation No. 2007-509769 of the PCT International Publication and Japanese Patent Laid-Open No. 2016-54231, amounts of consumption of replacement gases can be large.

SUMMARY OF THE INVENTION

An exemplary objective of the present invention is to provide an imprint apparatus which is advantageous in view of reduction of an amount of consumption of replacement gas.

The present invention is an imprint apparatus for bringing a mold into contact with an imprint material supplied onto a plurality of shot regions formed on a substrate and forming a pattern on the substrate including: a gas supply unit configured to supply a gas to a space between the mold and the substrate; a positioning unit configured to change a gap between the mold and the substrate; and a controller configured to control the gas supply unit and the positioning unit, wherein the controller causes second contact between a second shot region different from a first shot region and the mold after first contact between the first shot region having the imprint material supplied thereon among the plurality of shot regions and the mold and controls the positioning unit so that a second gap of the mold and the substrate at the time of changing a relative position between the mold and the substrate in a surface direction from the first shot region to the second shot region is shorter than a first gap of the mold and the substrate at the time of gas supply.

Further features of the present invention will become apparent from the following description of exemplary embodiments with reference to the attached drawings.

DESCRIPTION OF THE EMBODIMENTS

Embodiments for carrying out the present invention will be described below with reference to the drawings and the like.

First Embodiment

In this specification and the accompanying drawings, directions are illustrated in an XYZ coordinate system in which a plane with a direction parallel to a surface of a substrate is set to an XY plane. Directions parallel to an X axis, a Y axis, and a Z axis in the XYZ coordinate system are set to an X direction, a Y direction, and a Z direction and rotation around the X axis, rotation around the Y axis, and rotation around the Z axis are set to θX, θY, and θZ. Control or driving with respect to the X axis, the Y axis, and the Z axis refers to control or driving in a direction parallel to the X axis, a direction parallel to the Y axis, and a direction parallel to the Z axis. Positioning refers to controlling a position, an attitude, or an inclination. Alignment can include controlling a position, an attitude, and an inclination of at least one of a substrate and a mold.

Figure 1:
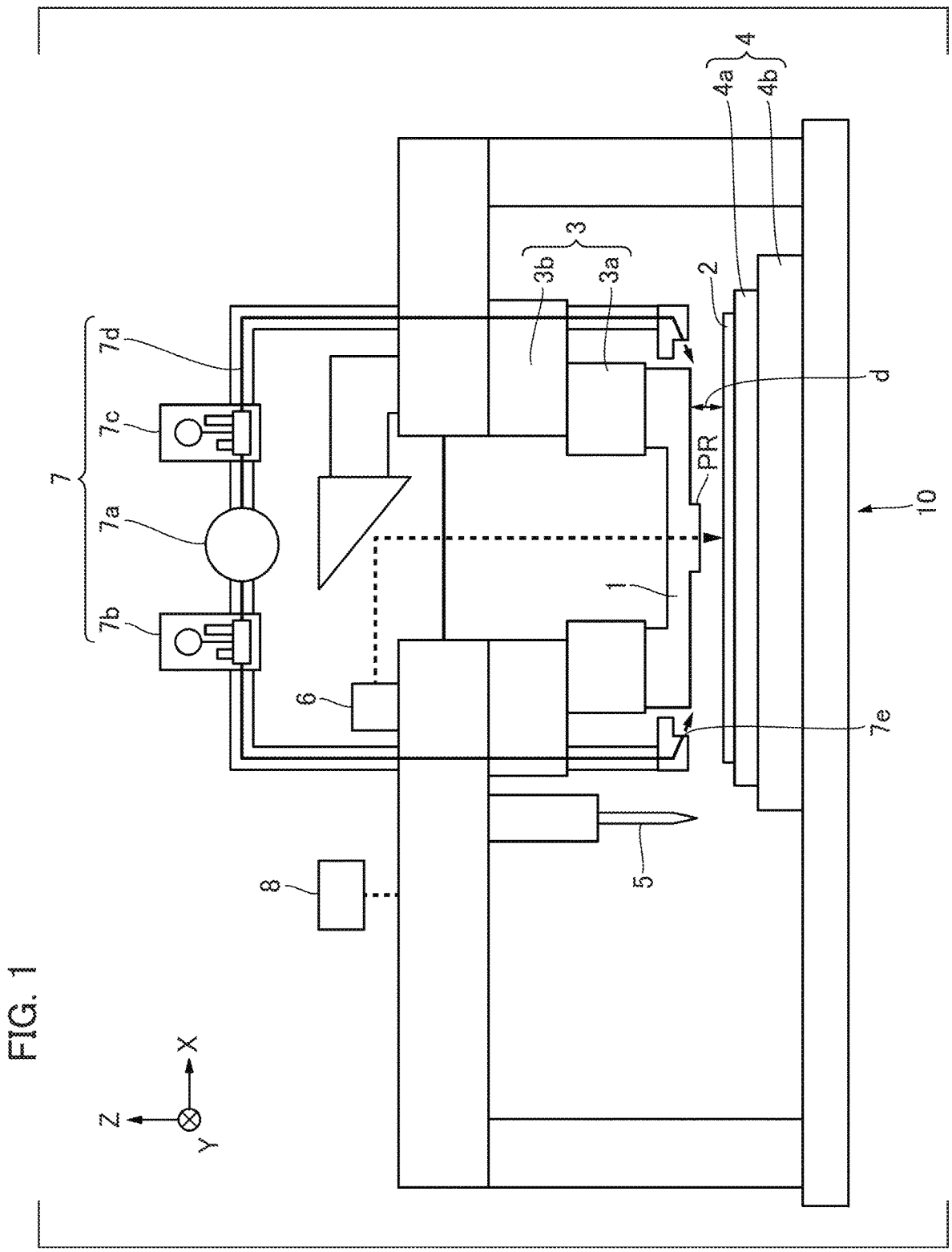
FIG. 1 is a schematic diagram illustrating a constitution of an imprint apparatus according to a first embodiment.

FIG. 1 is a schematic diagram illustrating a constitution of an imprint apparatus 10 according to a first embodiment of the present invention. The imprint apparatus 10 is a lithography apparatus used for a process of manufacturing an article such as a semiconductor apparatus. The imprint apparatus 10 performs an imprint process of bringing (imprinting) an imprint material supplied onto a substrate into contact with (on) a pattern region of a mold, providing curing energy to the imprint material to cure the imprint material, and releasing the mold from the imprint material. Thus, a pattern of a cured product to which a concave and convex pattern of the pattern region of the mold is transferred is formed on the substrate.

A curable composition cured when curing energy is provided to the curable composition (referred to as an uncured resin in some cases) is used as an imprint material. Examples of curing energy include electromagnetic waves, heat, and the like. Examples of electromagnetic waves includes light such as infrared rays, visible rays, and ultraviolet rays whose wavelengths are selected from a range of 10 nm or more and 1 mm or less.

Curable compositions are compositions cured due to light irradiation or heating. Among them, a photocurable composition cured due to light irradiation may contain at least a heavy synthetic compound and a photopolymerization initiator and contain a non-heavy synthetic compound or a solvent if necessary. The non-heavy synthetic compound is at least one selected from the group of a sensitizer, a hydrogen donor, an internal additive type releasing agent, a surfactant, an antioxidant, a polymer component, and the like.

An imprint material may be applied onto a substrate in the form of a film. Furthermore, an imprint material may be applied onto a substrate in the form of droplets or in the form of islands or films obtained by connecting a plurality of droplets through a liquid discharging head. The viscosity (viscosity at 25° C.) of the imprint material can be, for example, 1 mPa·s or more and 100 mPa·s or less.

The imprint apparatus 10 includes, for example, a mold positioning unit 3 configured to hold a mold 1 and position the mold 1, a substrate positioning unit 4 configured to hold a substrate 2 and position the substrate 2, a material supply unit 5, a curing unit 6, a gas supply unit 7, and a controller 8.

The mold 1 has, for example, a rectangular outer form and is made of a material such as quartz through which ultraviolet rays are transmitted. A surface of the mold 1 facing the substrate 2 has a pattern region PR. In the pattern region PR, a concave and convex pattern to be transferred to an imprint material supplied onto a shot region of the substrate 2 is formed in a three-dimensional shape. The pattern region PR is also referred to as a mesa and is formed in a convex portion of several tens μm to several hundred μm so that a region other than the pattern region PR of the mold 1 does not come into contact with the substrate 2.

The substrate 2 is made of, for example, a semiconductor (for example, silicon or a compound semiconductor), glass, a ceramic, a metal, a resin, or the like. The substrate 2 can have one or more layers on a base material. In this case, the base material is formed of, for example, a semiconductor, glass, a ceramic, a metal, a resin, or the like. An adhesion layer can be provided on the substrate 2 to improve the adhesion between the imprint material and the substrate 2 if necessary. A plurality of shot regions are formed on the substrate 2.

The mold positioning unit 3 can include a mold holding unit 3a and a mold driving mechanism 3b. The mold holding unit 3a holds the mold 1, for example, using a vacuum suction force, an electrostatic force, or the like. The mold driving mechanism 3b is a driving system for changing a distance d (gap) between the mold 1 and the substrate 2. The mold driving mechanism 3b drives (moves) the mold 1 in a Z-axis direction by driving the mold holding unit 3a. The mold driving mechanism 3b includes, for example, an actuator such as a linear motor and an air cylinder and drives the mold holding unit 3a having the mold 1 held therein. The mold driving mechanism 3b is configured to drive the mold 1 (the mold holding unit 3a) with respect to a plurality of axes (for example, three axes, i.e., the Z axis, the θX axis, and the θY axis). In order to realize highly accurate positioning of the mold 1, the mold driving mechanism 3b may include a plurality of driving system such as a coarse driving system and a fine driving system. Furthermore, the mold driving mechanism 3b may have a function of driving the mold 1 and a function of correcting an inclination of the mold 1 in the Z-axis direction as well as in an X-axis direction, a Y-axis direction, and a θZ direction.

The substrate positioning unit 4 can include a substrate holding unit 4a configured to hold the substrate 2 and a substrate driving mechanism 4b. The substrate holding unit 4a holds the substrate 2 using, for example, a vacuum suction force, an electrostatic force, or the like. The substrate driving mechanism 4b drives (moves) the substrate 2 in the X-axis direction and the Y-axis direction by driving the substrate holding unit 4a. The substrate driving mechanism 4b includes an actuator such as a linear motor and an air cylinder and drives the substrate holding unit 4a having the substrate 2 held therein. The substrate driving mechanism 4b can be configured to drive the substrate 2 (the substrate holding unit 4a) with respect to a plurality of axes (for example, three axes, i.e., the X axis, the Y axis, and the θZ axis; preferably, six axes, i.e., the X axis, the Y axis, the Z axis, the θX axis, the θY axis, and the θZ axis). The substrate driving mechanism 4b may include a plurality of driving systems such as a coarse driving system and a fine driving system. The substrate driving mechanism 4b may have a function of driving the substrate 2 in the Z-axis direction and θ (rotation around the Z axis) direction and a function of correcting an inclination of the substrate 2.

The mold positioning unit 3 and the substrate positioning unit 4 are mechanisms configured to drive the mold 1 or the substrate 2 so that a relative position, a relative attitude, and a relative inclination with respect to an XY plane direction between the mold 1 and the substrate 2 which is a surface direction of the mold 1 and the substrate 2 are changed and determine a relative position between the mold 1 and the substrate 2. The mold positioning unit 3 and the substrate positioning unit 4 can be used to perform alignment for reducing a relative shift and an error component associated with rotation between the pattern region PR of the mold 1 and a shot region of the substrate 2. The mold positioning unit 3 and the substrate positioning unit 4 may detect alignment marks provided on the mold 1 and the substrate 2 using, for example, an alignment measurement unit (not shown) and perform alignment.

Also, the mold positioning unit 3 and the substrate positioning unit 4 are mechanisms configured to change the distance d (gap) and drive the mold 1 or the substrate 2 so that a relative position, a relative attitude, and a relative inclination in the Z direction between the mold 1 and the substrate 2 are adjusted. Adjustment of the relative position in the Z direction using the mold positioning unit 3 or the substrate positioning unit 4 includes performing driving to bring (imprint) the pattern region PR of the mold 1 into contact with (on) the imprint material on the substrate 2 and separate (release) the pattern region PR of the mold 1 from the cured imprint material (a pattern of the cured product). The distance d can be detected by, for example, a laser interferometer, an encoder, or the like provided in the mold positioning unit 3 or the substrate positioning unit 4, and as a result, changed on the basis of the detection result. It should be noted that the method of detecting the distance d is not limited thereto.

The material supply unit 5 (a dispenser) supplies (applies), as an uncured material, an imprint material onto a shot region formed on the substrate 2. The material supply unit 5 includes, for example, a discharge port configured to discharge an imprint material and drops the uncured imprint material onto the substrate 2 through such a discharge port. The supply of the imprint material onto the substrate 2 can be performed, for example, by discharging the imprint material from the material supply unit 5 while moving the substrate 2 using the substrate positioning unit 4. The material supply unit 5 may be provided outside of the imprint apparatus 10. In this embodiment, the material supply unit 5 supplies the imprint material to a plurality of shot regions at one time.

The curing unit 6 causes the imprint material to be cured by supplying or radiating curing energy (for example, light such as ultraviolet rays and the like) for the imprint material via the mold 1 in a state in which the imprint material on the shot region of the substrate 2 is in contact with the pattern region PR of the mold 1. Thus, a pattern constituted of the cured product made of the imprint material is formed. In this embodiment, the curing unit 6 has, for example, a light source configured to emit light (exposure light such as ultraviolet rays) for curing the imprint material. Furthermore, the curing unit 6 may include an optical element for adjusting light emitted from the light source such that it becomes appropriate light in the imprint process. In this embodiment, although a light source is configured to emit ultraviolet rays because a light curing method is adopted, for example, if a thermal cycling method is adopted, a heat source for curing a thermosetting resin as an imprint material is used instead of a light source.

The gas supply unit 7 supplies a replacement gas to a space between the mold 1 and the substrate 2 and replaces a gas in the space between the mold 1 and the substrate 2 with the replacement gas. When air bubbles have been incorporated between the mold 1 and the imprint material at the time of curing the imprint material, a place in which the air bubbles are present may not be filled with an imprint material and defects can occur in the pattern of the cured product. At the time of imprinting, the gas supply unit 7 replaces a gas in the space between the mold 1 and the imprint material with a permeating gas which readily permeates into the mold 1 or the imprint material. It should be noted that the gas may be replaced with a condensable gas or the like which condenses and liquefies due to a pressure rise when the mold 1 is brought into contact with the imprint material. Examples of the permeating gas include helium gas (He) and examples of the condensable gas include pentafluoropropane (PFP). In this embodiment, a replacement gas is a permeating gas, a condensable gas, and the like and if "a gas" is referred to hereinafter, this refer to this replacement gas.

If a permeating gas is used as a replacement gas, by replacing the gas in the space between the mold 1 and the substrate 2, even when some gas remains between the mold 1 and the imprint material at the time of imprinting, the permeating gas passes through the mold or the imprint material and the pattern region of the mold is filled with the imprint material. Thus, it is possible to reduce the number of defects generated in the pattern of the cured product. Furthermore, also if a condensable gas is used as a replacement gas, the remaining gas liquefies. Thus, it is possible to reduce the number of pattern defects.

The gas supply unit 7 can include a gas supply source 7a, gas controllers 7b and 7c, and a gas supply path 7d. The gas supply source 7a is a replacement gas supply source and includes a tank filled with a gas or is connected to an external gas supply source. The gas controllers 7b and 7c control a flow rate of a gas. The gas controllers 7b and 7c are constituted of, for example, mass flow controllers (MFCs). The gas supply path 7d is configured to be capable of releasing a gas through a plurality of supply ports 7e provided around the mold 1 held in the mold positioning unit 3. A flow rate of a gas supplied from the gas supply source 7a is controlled by the gas controllers 7b and 7c and the gas is discharged from the supply ports 7e through the gas supply path 7d. Thus, the replacement gas is supplied to the space between the mold 1 and the substrate 2.

The controller 8 controls the mold positioning unit 3, the substrate positioning unit 4, the material supply unit 5, the curing unit (irradiation unit) 6, the gas supply unit 7, and the like and controls the entire (operation) of the imprint apparatus 10. Furthermore, the controller 8 controls each unit of the imprint apparatus 10 and performs an imprint process. The controller 8 can be configured of a PLD (abbreviation for programmable logic apparatus) such as an FPGA (abbreviation for a field programmable gate array), a general-purpose computer in which an ASIC (abbreviation for application specific integrated circuit) and a program are installed, or a combination of all or a part of these. In this embodiment, the controller 8 controls the mold positioning unit 3 so that a second gap which is a distance d at the time of changing a relative position in the surface direction of the mold 1 and the substrate 2 from a first shot region to a second shot region is shorter than a first gap which is a distance d at the time of supplying a gas. Although will be described in detail later, at that time, the distance d may be changed by controlling the substrate positioning unit 4 and the distance d may be changed by controlling both of the mold positioning unit 3 and the substrate positioning unit.

Figure 2B:
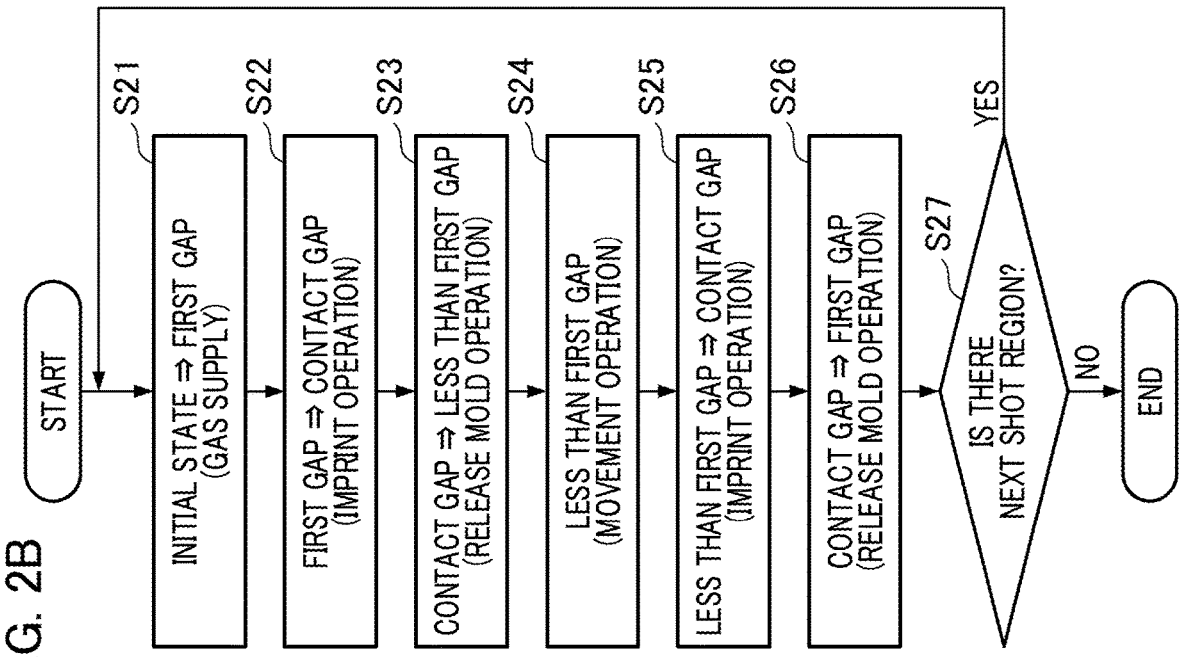
FIGS. 2A and 2B are flowcharts for describing an imprint process of an imprint apparatus according to the first embodiment.
Figure 2A:
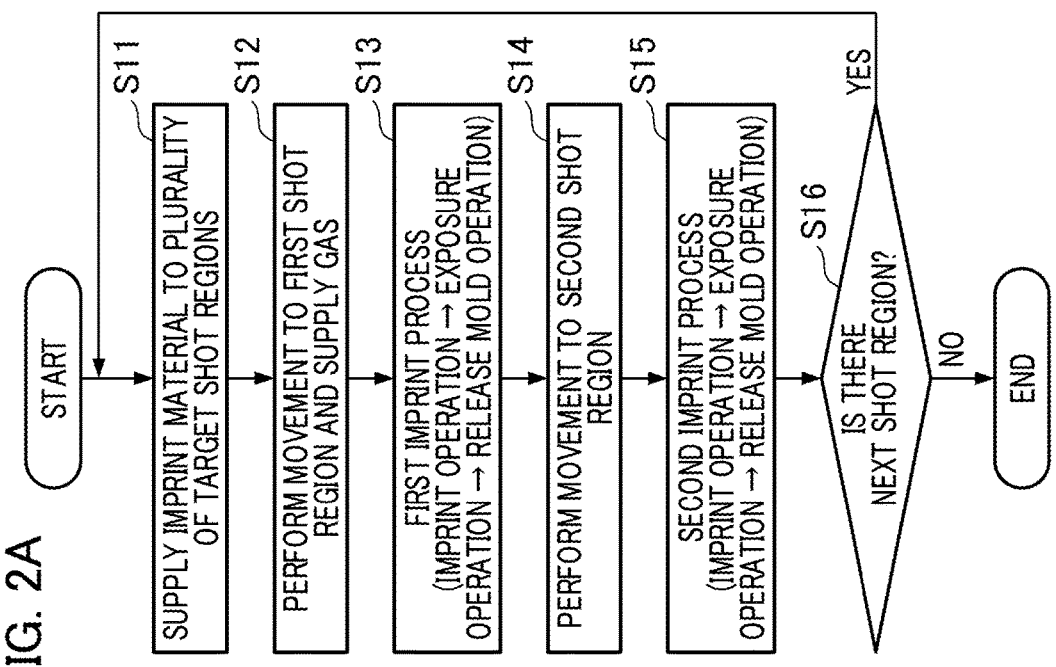

FIGS. 2A and 2B are flowcharts for describing the imprint process of the imprint apparatus 10 according to the first embodiment. FIG. 2A illustrates a process of forming a pattern in a plurality of shot regions of the substrate 2. FIG. 2B illustrates an operation of the mold positioning unit 3 at that time. These processes are controlled by the controller 8. Description of conveying (loading) of the mold 1 to the mold holding unit 3a, conveying (unloading) of the mold 1 from the mold holding unit 3a, conveying (loading) of the substrate 2 to the substrate holding unit 4a, and conveying (unloading) of the substrate 2 from the substrate holding unit 4a will be omitted.

First, a flow of FIG. 2A will be described. In Step S11, an imprint material is supplied to a plurality of target shot regions. To be specific, the controller 8 controls the material supply unit 5 and the substrate positioning unit 4 (the substrate driving mechanism 4b) so that the imprint material is supplied to the first shot region on the substrate 2 on which the next imprint process is performed and the second shot region in the first shot region on which the next imprint process is performed. It should be noted that the first shot region and the second shot region are different shot regions. By supplying the imprint material collectively to a plurality of different shot regions and continuously bringing the mold 1 into contact with the substrate 2, as compared with a case in which the imprint material is supplied for each shot area, the time for moving the substrate 2 under the material supply unit 5 is shortened. Furthermore, in the first shot region and the second shot region, in order to shorten the moving time of the substrate 2, it is desirable that a plurality of adjacent shot regions be selected.

In Step S12, the controller 8 controls the substrate positioning unit 4 (the substrate driving mechanism 4b) so that the first shot region of the substrate 2 is disposed below the pattern region PR of the mold 1. At the same time, the gas supply unit 7 is controlled so that the space between the mold 1 and the substrate 2 is filled with a gas. That is to say, the gas supply unit 7 supplies a gas to the space between the mold 1 and the substrate 2 before the contact (first contact) with the first shot region.

In Step S13, the controller 8 sequentially performs an imprint operation, an exposure operation, and a release mold operation (a first imprint process) on the first shot region of the substrate 2. The controller 8 controls the mold positioning unit 3 so that the imprint material on the first shot region of the substrate 2 comes into contact with the pattern region PR to move the mold 1 in the −Z direction. This is regarded as an imprint operation. Subsequently, the controller 8 controls the curing unit 6 to cure an imprint material on the first shot region. That is to say, the curing unit 6 irradiates the imprint material on the first shot region with ultraviolet rays for curing an imprint material. Thus, a pattern formed of a cured product made of the imprint material is formed on a target shot region. This is regarded to as an exposure operation. Subsequently, the controller 8 controls the mold positioning unit 3 so that the pattern formed of the cured product made of the imprint material and the pattern region PR of the mold 1 are released from each other to move the mold 1 in the +Z direction. This is regarded as a release mold operation. It should be noted that, in changing a distance d of the imprint operation, the release mold operation, or the like, the substrate 2 may be moved by controlling the substrate positioning unit 4 and both of the mold 1 and the substrate 2 may be moved by controlling both of the mold positioning unit 3 and the substrate positioning unit 4. The same applies to the following description.

In Step S14, the controller 8 controls the substrate positioning unit 4 (the substrate driving mechanism 4b) so that the second shot region of the substrate 2 is disposed below the pattern region PR of the mold 1 to change a relative position of the mold 1 and the substrate 2 in the surface direction. This is regarded as a movement operation. In Step S15, the controller 8 sequentially performs the imprint operation, the exposure operation, and the release mold operation (a second imprint process) on the second shot region of the substrate 2. The controller 8 controls the mold positioning unit 3 so that the imprint material on the second shot region of the substrate 2 comes into contact with the pattern region PR of the mold 1 (second contact). Subsequently, the controller 8 controls the curing unit 6 so that the imprint material on the second shot region is cured. Thus, a pattern formed of the cured product made of the imprint material is formed on a target shot region. Subsequently, the controller 8 controls the mold positioning unit 3 so that the pattern formed of the cured product made of the imprint material and the pattern region PR of the mold 1 are separated from each other to move the mold 1 in the +Z direction.

In Step S16, the controller 8 determines whether there is a shot region on which the next pattern is to be formed on the substrate 2. If it is determined that there is a shot region in which the next pattern is to be formed, the process returns to the process of Step S11 and the processes of S11 to S15 are repeated.

A flow of the operation of the mold positioning unit 3 illustrated in FIG. 2B will be described. The flow of FIG. 2B illustrates the operation of the mold positioning unit 3 during execution of the flow of FIG. 2A. Step S21 is executed before supply of a gas in Step S12 is started. In Step S21, the mold positioning unit 3 changes the distance d from an initial gap to a gap into which a gas can be supplied. The distance d at the time of supplying the gas is referred to as a first gap. The initial gap is a distance d between the mold 1 and the substrate 2 at the time of starting Step S11. Here, the distance d indicates an interval between the surface (the XY plane) on which the pattern of the mold 1 is formed and the surface (the XY plane) in an imprint direction (a direction along the Z axis).

Step S22 is executed during the imprint operation in Step S13. In Step S22, the mold positioning unit 3 reduces the distance d so that the mold 1 comes into contact with the imprint material on the first shot region of the substrate 2. The distance d at the time of contact between the mold 1 and the imprint material on the substrate 2 is set to be a contact gap and the mold positioning unit 3 changes the distance d so that the distance d finally reaches the contact gap. At that time, contact occurs only between the pattern region PR of the mold 1 and the imprint material. Since the pattern region PR is formed in a convex portion of several tens μm to several hundred μm, the mold 1 and the substrate 2 do not come into direct contact with each other and the distance d does not become 0. Therefore, the contact gap is a sum of a thickness (several tens μm to several hundred μm) of the convex portion of the pattern region PR and a thickness of the imprint material. It should be noted that, although the distance d is the interval between the surface of the region surrounding the pattern region PR and the surface of the substrate 2 herein, an interval between the surface of the pattern region PR of the mold 1 and the surface of the substrate 2 may be set as the distance d.

Step S23 is executed during the release mold operation of the first shot region in Step S13. In Step S23, the mold positioning unit 3 increases the distance d between the mold 1 and the substrate 2 so that the mold 1 and the imprint material on the substrate 2 are separated from each other. The mold positioning unit 3 changes the distance d so that the distance d finally reaches a value smaller than the first gap (less than the first gap). It should be noted that, at that time, the distance d may temporarily exceed the first gap due to a mold releasing force for moving the mold 1 in the +Z direction for performing the release mold operation. Step S24 is executed during the movement operation from the first shot region to the second shot region in Step S14. In Step S24, the distance d is maintained to be less than the first gap. It should be noted that a maximum value of the distance d at that time may be smaller than the first gap and it is not necessary to maintain the distance d to have a constant value during the movement. Here, the distance d when the movement operation is executed is referred to as a second gap.

Step S25 is executed during the imprint operation in Step S15. In Step S25, the mold positioning unit 3 reduces the distance d so that the mold 1 comes into contact with the imprint material on the second shot region of the substrate 2. The mold positioning unit 3 changes the distance d so that the distance d finally reaches the contact gap.

Step S26 is executed at the time of the release mold operation of the second shot region in Step S15. In Step S26, the mold positioning unit 3 increases the distance d so that the mold 1 and the imprint material on the substrate 2 are separated from each other. The mold positioning unit 3 changes the distance d so that the distance d finally reaches the first gap. By setting the distance d to the first gap, a gas is supplied again. Step S27 is the same as Step S16.

Steps S12 to S15 will be described in detail below in view of gas supply with reference to FIGS. 3A to 8. FIGS. 3A to 8 are schematic diagrams illustrating gas supply courses. FIGS. 3A to 8 are XZ-cross-sectional views of the imprint apparatus 10 and illustrate only the vicinity of the mold 1, the substrate 2, the mold positioning unit 3, the substrate positioning unit 4, the material supply unit 5, and the gas supply path 7d.

Figure 3A:
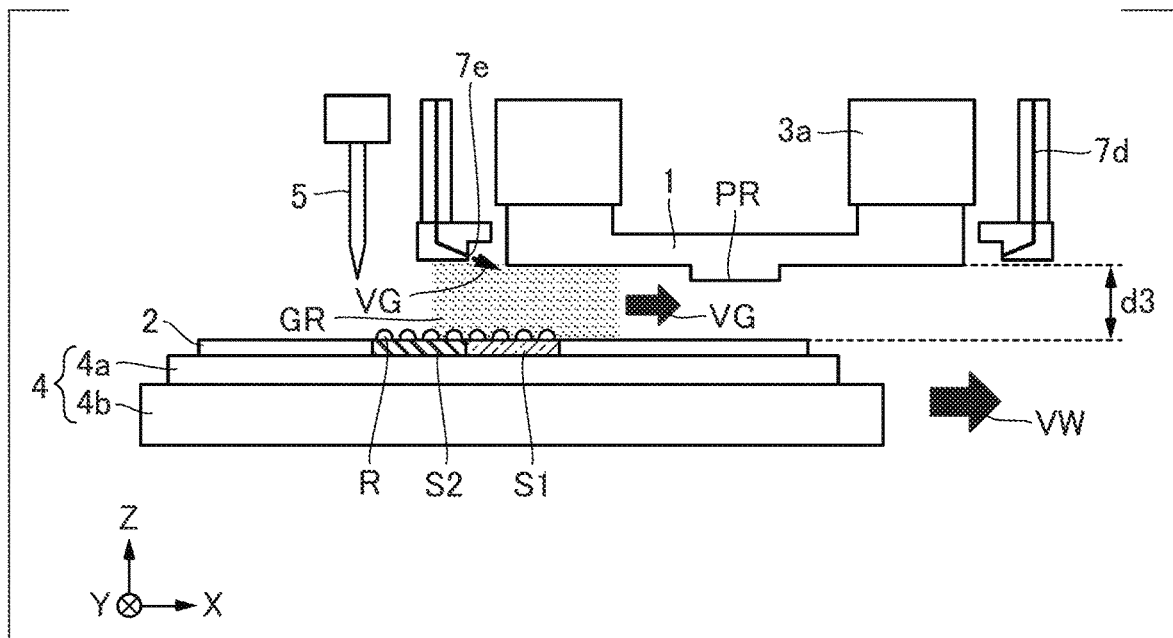
FIGS. 3A, 3B, 4A, 4B, 5A, 5B, 6A, 6B, 7A, 7B, and 8 are schematic diagrams illustrating gas supply courses.

FIG. 3A illustrates a state of the imprint apparatus 10 during the executing of Step S12. An imprint material R has already been applied on a first shot region S1 and a second shot region S2 located in a central portion of the substrate 2. The substrate 2 is moved in a direction indicated by an arrow VW so that the first shot region S1 is disposed below the pattern region PR of the mold 1 using the substrate positioning unit 4. At the same time, the gas supply path 7d supplies a gas in a gas discharge direction VG1 from the supply port 7e. At that time, it is necessary to set the distance d between the mold 1 and the substrate 2 to a first gap d3 so that a gas easily enters between the mold 1 and the substrate 2. A gas region GR indicated by the shaded pattern is a region in which a concentration of a gas concentration is higher than a concentration of air. At that time, the substrate 2 moves in an arrow VW direction (the +X direction) and the mold 1 is stationary. A gas supplied between the mold 1 and the substrate 2 is dragged by the substrate 2 and flows in an arrow VG direction which is directed toward the lower side of the mold 1.

Figure 9:
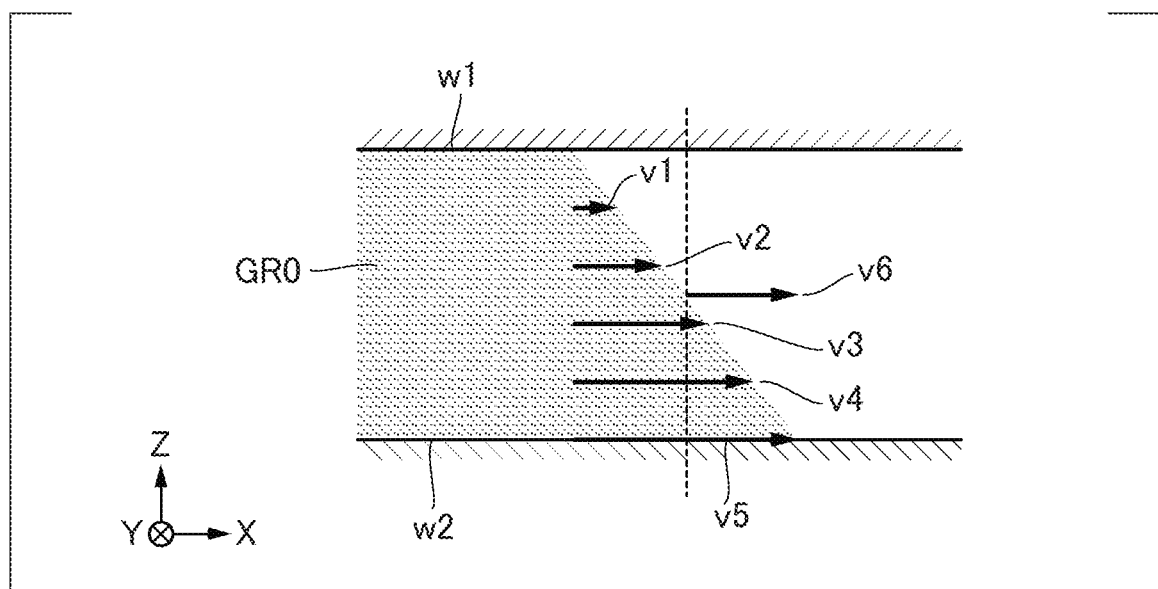
FIG. 9 is a diagram for explaining a gas flow.

A state in which the supplied gas flows toward the downside of the mold 1 will be described with reference to FIG. 9. FIG. 9 is a diagram for explaining the gas flow. FIG. 9 illustrates only the space between the mold 1 and the substrate 2 in the XZ-cross-sectional view and illustrates a velocity distribution of a fluid between the mold 1 and the substrate 2. Furthermore, FIG. 9 illustrates a bottom surface w1 (a surface facing the substrate 2) of the mold 1 and a surface w2 (a surface facing the mold 1) of the substrate 2. Since the substrate 2 is moving, a speed of the surface w2 of the substrate 2 is equal to a moving speed of the substrate 2. Since the mold 1 is stationary, a speed of the bottom surface w1 of the mold 1 is 0. Therefore, a fluid in a space sandwiched between the bottom surface w1 of the mold 1 and the surface w2 of the substrate 2 has a Couetter flow whose speed linearly decreases from the surface w2 side of the substrate 2 toward the bottom surface w1 of the mold 1 as expressed as velocity vectors v1, v2, v3, v4, and v5 in FIG. 9. The gas between the surface w2 of the substrate 2 and the bottom surface w1 of the mold 1 moves on average at a speed that is half the moving speed of the substrate 2 as indicated by a velocity vector v6. Therefore, the gas supplied between the mold 1 and the substrate 2 flows toward the lower side of the mold 1 at a speed which is half the substrate moving speed.

Figure 3B:
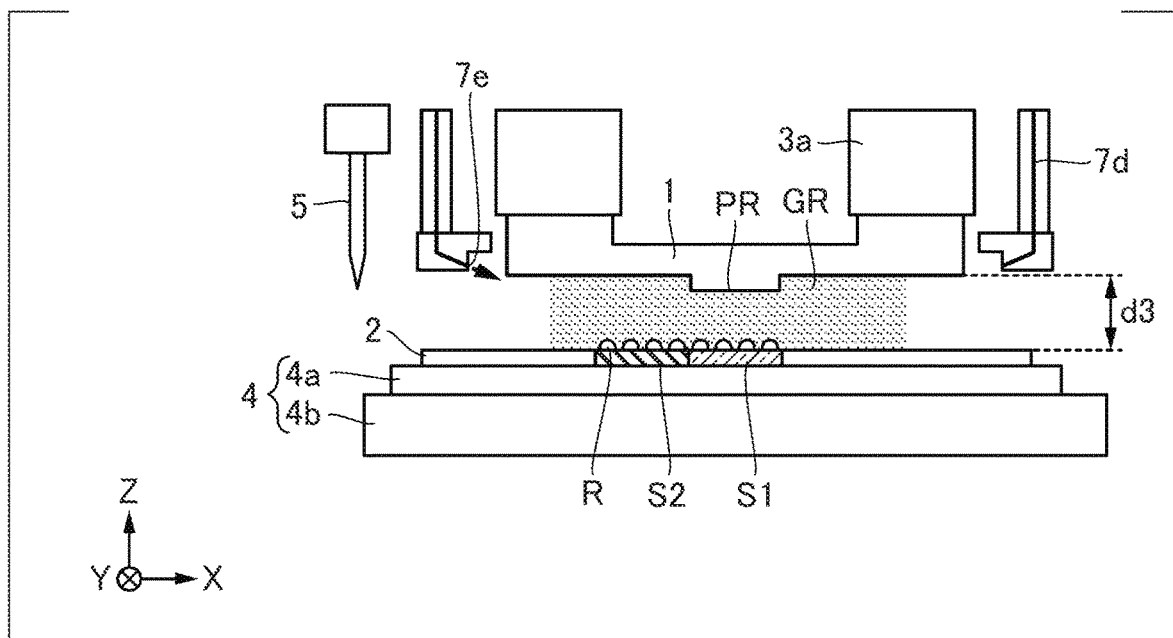

FIG. 3B illustrates a state in which Step S12 is completed. The first shot region S1 is disposed below the pattern region PR of the mold 1. At that time, the gas region GR is in the space between the mold 1 and the substrate 2 and the space between the pattern region PR of the mold 1 and the first shot region S1 is filled with a gas. At that time, the distance d between the mold 1 and the substrate 2 still remains at the first gap d3.

Figure 4A:
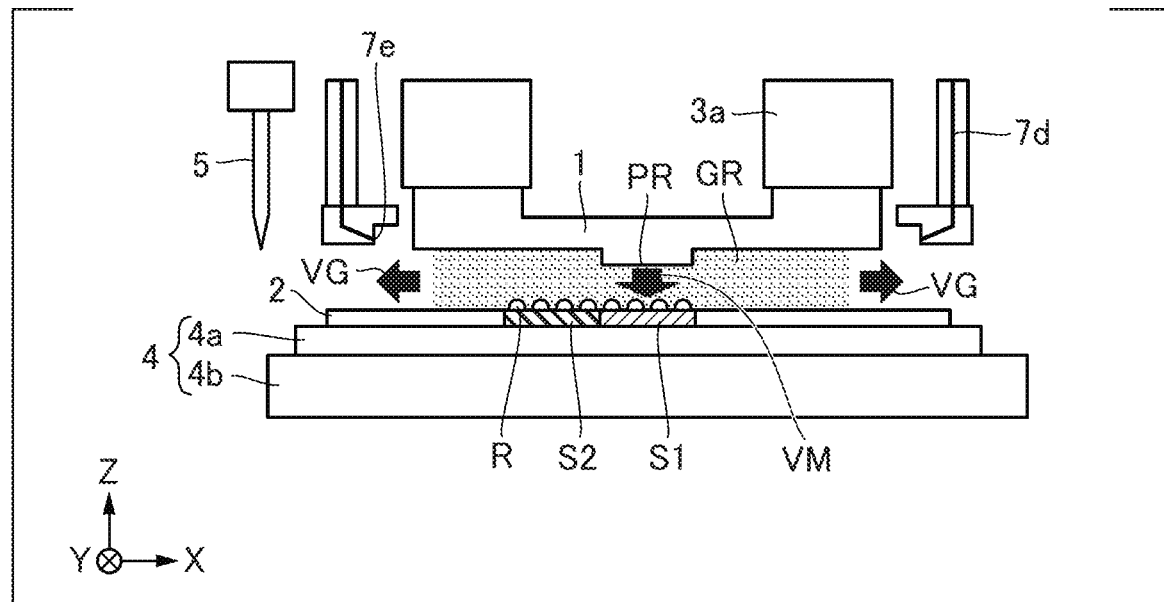

FIG. 4A illustrates a state at the time of the imprint operation in Step S13. The mold 1 is moving toward the first shot region S1 of the substrate 2 (an arrow VM direction) using the mold positioning unit 3. A gas in the space between the substrate 2 and the mold 1 flows toward the vicinity of the mold 1 because a volume of the space between the mold 1 and the substrate 2 decreases when the mold 1 is pushed down. Therefore, the gas region GR flows in the arrow VG direction. An area of the gas region GR increases when viewed in the XY plane. In order not to cause defects in the above-described cured product, it is important to increase the concentration of gas between the pattern region PR of the mold 1 and the imprint material in the state of FIG. 4A at the time of imprinting.

Figure 4B:
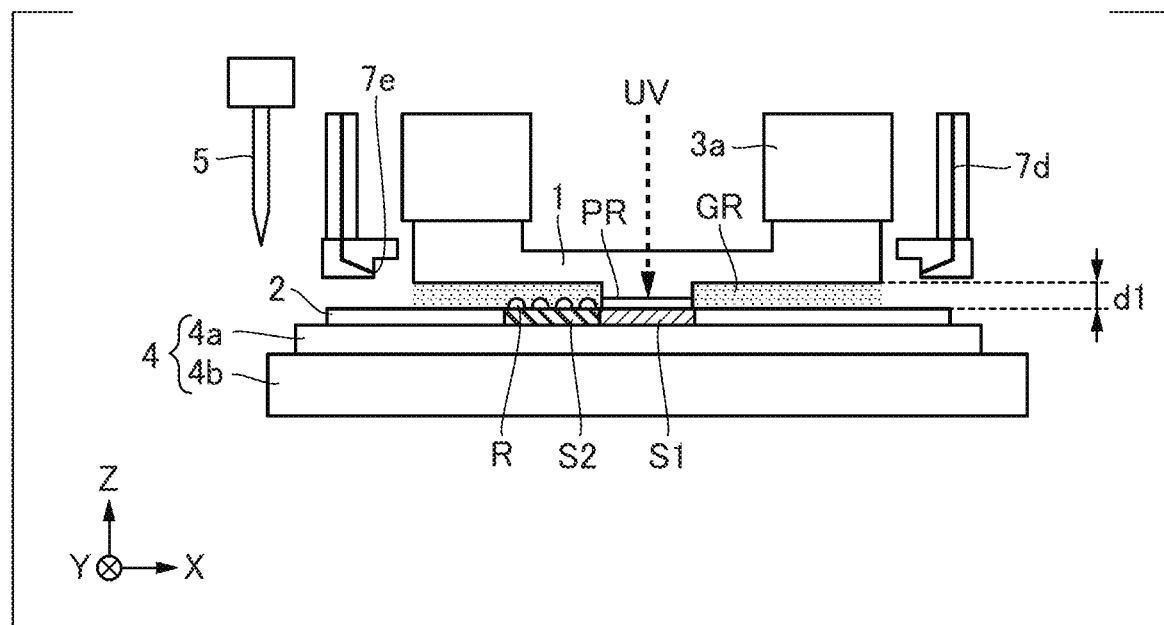

FIG. 4B illustrates a state at the time of the exposure operation in Step S13. The imprint material is irradiated with exposure light UV in a state in which the pattern region PR of the mold 1 and the first shot region S1 of the substrate 2 come into contact with each other via an imprint material. The exposure light UV is configured so that only the pattern region PR portion of the mold 1 is irradiated with the light. Thus, the imprint material R on the first shot region S1 is cured. At that time, the distance d is a contact gap d1.

Figure 5A:
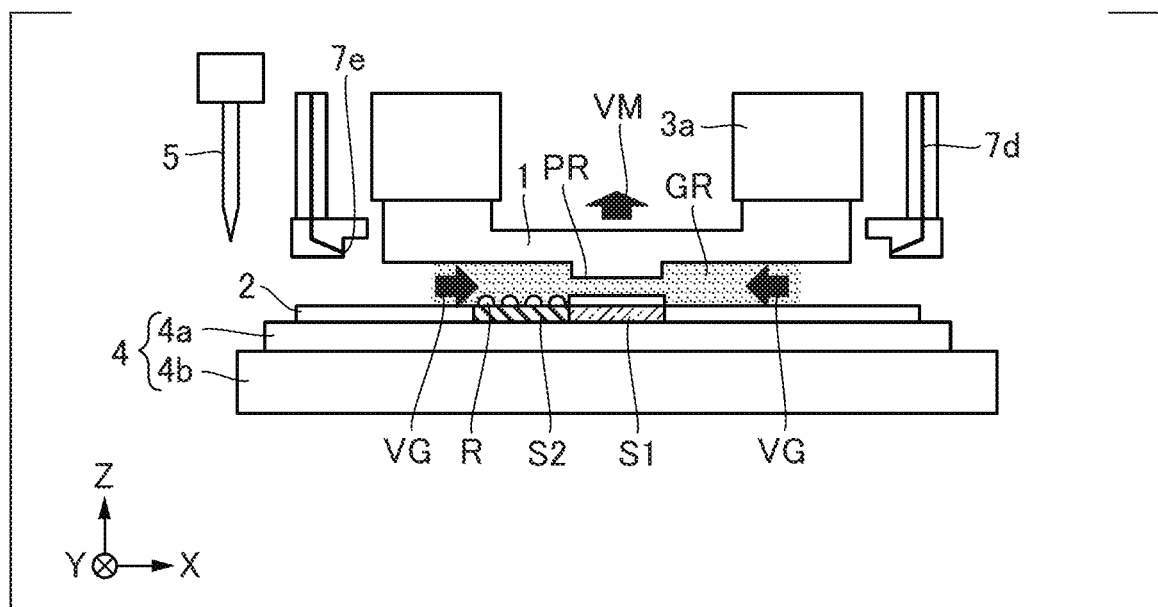

FIG. 5A illustrates a state at the time of the release mold operation in Step S13. The mold 1 moves in a direction (an arrow VM direction) in which the mold 1 is away from the first shot region S1 of the substrate 2 using the mold positioning unit 3. The pattern region PR of the mold 1 and the imprint material R are separated from each other through this operation. Since a volume of the space between the mold 1 and the substrate 2 increases when the mold 1 is pulled up, a gas in the space between the substrate 2 and the mold 1 flows from the vicinity of the mold 1 toward the central portion of the mold 1. Therefore, the gas region GR flows in the arrow VG direction. Thus, when the mold 1 is pulled up, an area of the gas region GR decreases when viewed in the XY plane.

Figure 5B:
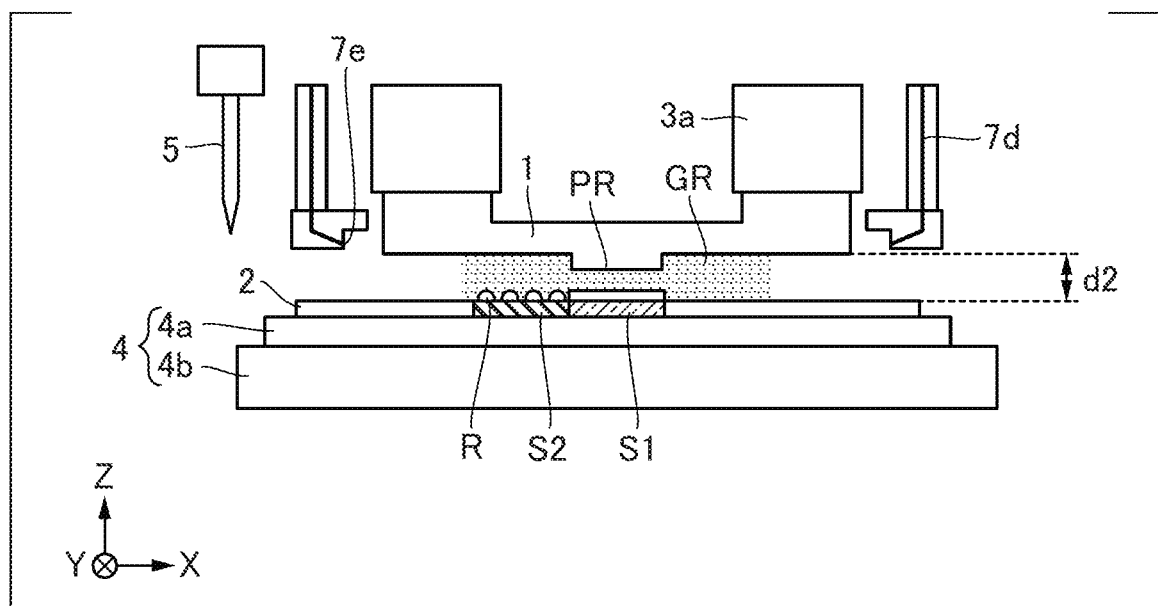

FIG. 5B illustrates a state in which Step S13 is completed. At that time, the gas region GR is in the space between the mold 1 and the substrate 2. A size of the gas region GR viewed in the XY plane direction at that time can be changed in accordance with an amount by which the mold 1 is pulled up at the time of mold-releasing in Step S13. It should be noted that, as described above, at that time, the distance d may temporarily exceed the first gap due the mold releasing force for performing the release mold operation.

Figure 6A:
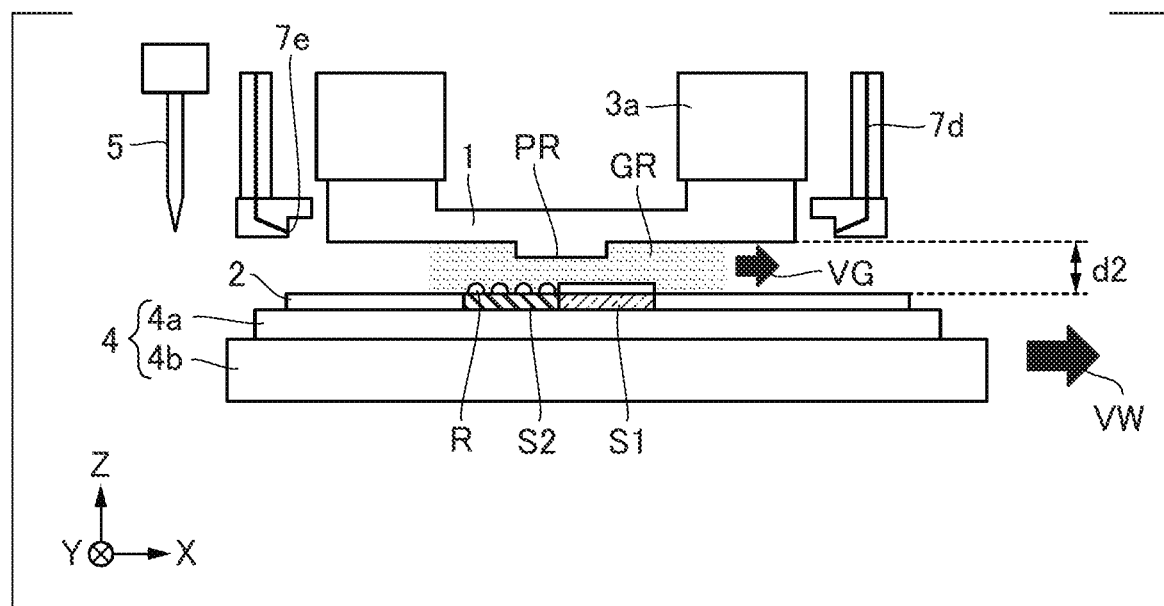

FIG. 6A illustrates the movement operation of the substrate 2 in Step S14. The substrate 2 moves in a direction indicated by an arrow VW (the +X direction) so that the second shot region S2 is disposed below the pattern region PR of the mold 1 using the substrate positioning unit 4. At that time, the substrate 2 moves in the arrow VW direction (the +X direction) and the mold 1 is stationary. The gas region GR is dragged and moved by the substrate 2 as indicated by the arrow VG. The mold positioning unit 3 causes a maximum value d2 of the distance d (the second gap) when the movement operation is performed to be a gap smaller than the first gap d3.

Figure 6B:
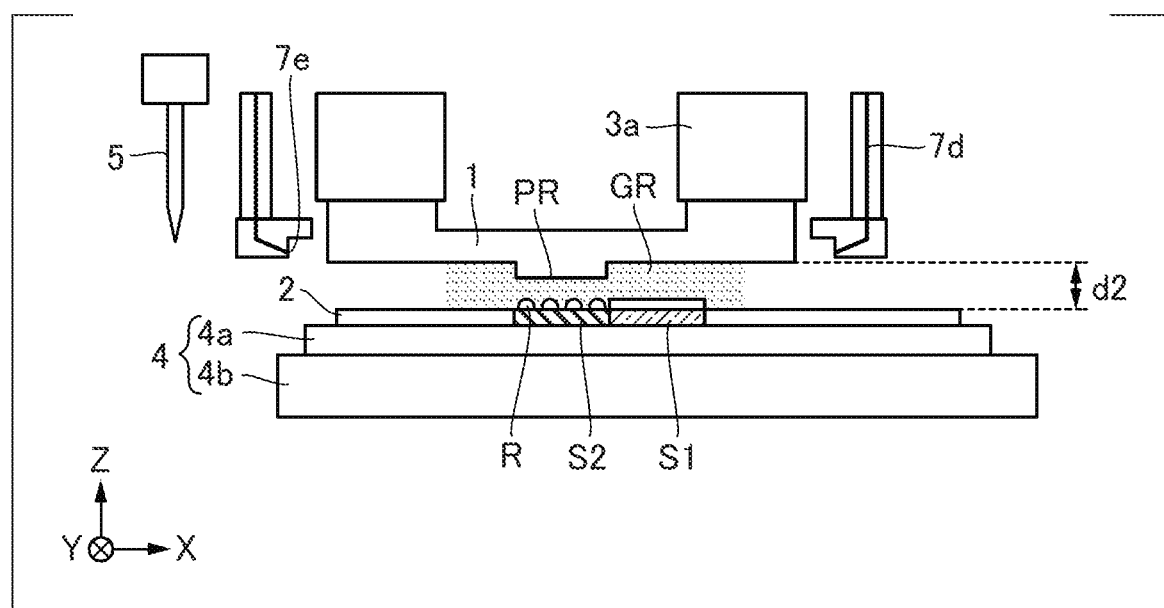

FIG. 6B illustrates a state in which Step S14 (the movement operation) is completed. The second shot region S2 is disposed below the pattern region PR. At that time, the gas region GR is in the space between the mold 1 and the substrate 2 and the space between the pattern region PR and the second shot region S2 is filled with a gas. It should be noted that, also at that time, the distance d is smaller than the first gap d3.

Figure 7A:
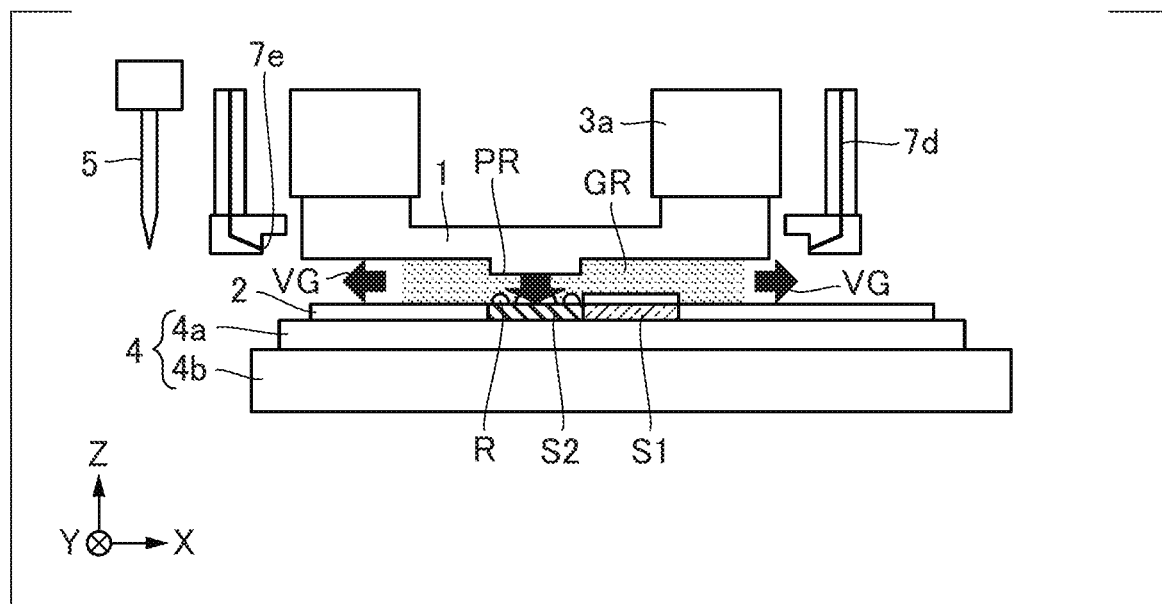

FIG. 7A illustrates a state at the time of the imprint operation in Step S15. The mold 1 moves toward the second shot region S2 of the substrate 2 (the arrow VM direction) using the mold positioning unit 3. Since the volume of the space between the mold 1 and the substrate 2 when the mold 1 is pushed down, a gas in the space between the mold 1 and the substrate 2 flows toward the vicinity of the mold 1. Therefore, a flow of the gas region GR is directed in the arrow VG direction. Therefore, an area of the gas region GR increase when viewed in the XY plane.

Figure 7B:
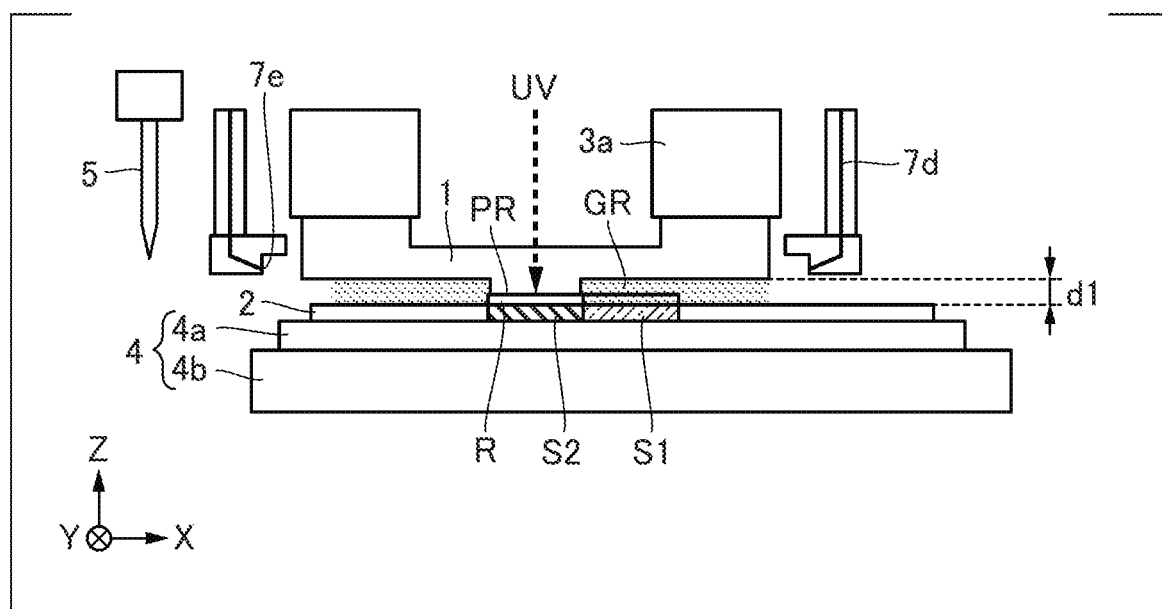

FIG. 7B illustrates a state at the time of the exposure operation in Step S15. An imprint material is irradiated with exposure light UV in a state in which the pattern region PR of the mold 1 comes into contact with the second shot region S2 of the substrate 2 via the imprint material. Thus, the imprint material R on the second shot region S2 is cured. At that time, the distance d is the contact gap d1.

Figure 8:
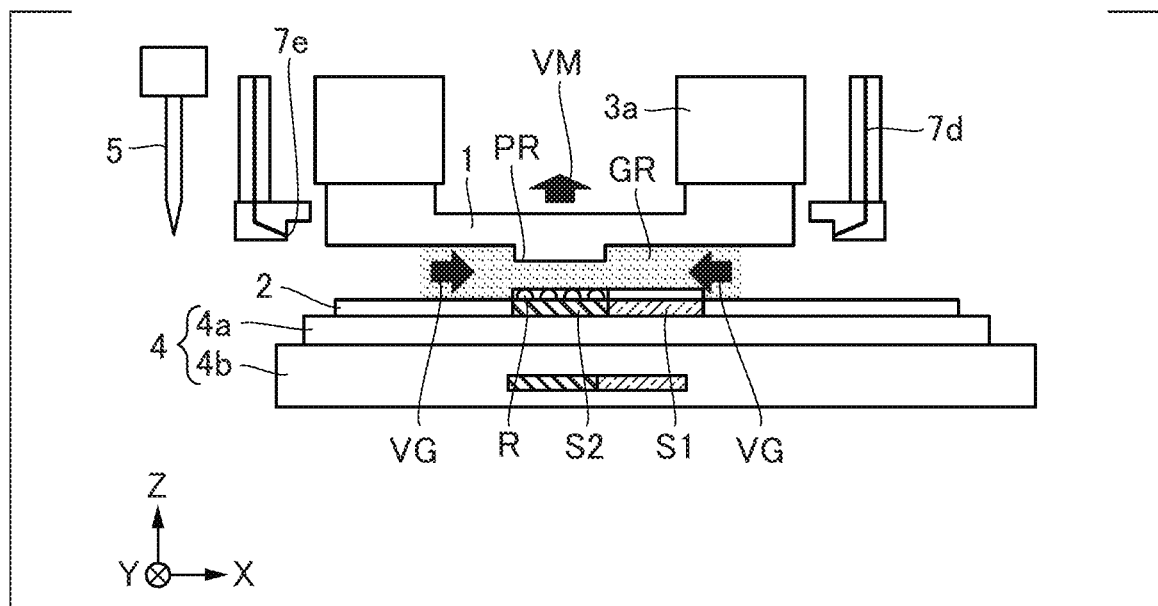

FIG. 8 illustrates a state at the time of mold releasing in Step S15. The mold 1 moves in a direction (the arrow VM direction) in which the mold 1 is away from the second shot region S2 of the substrate 2 using the mold positioning unit 3. The pattern region PR of the mold 1 and the imprint material R are separated from each other through this operation. A gas in the space between the substrate 2 and the mold 1 flows from the vicinity of the mold 1 toward the central portion of the mold 1 because the volume of the space between the mold 1 and the substrate 2 increases when the mold 1 is pulled up. Therefore, the flow of the gas region GR is directed in the arrow VG direction. Thus, when the mold 1 is pulled up, an area of the gas region GR decreases when viewed in the XY plane direction.

Figure 10:
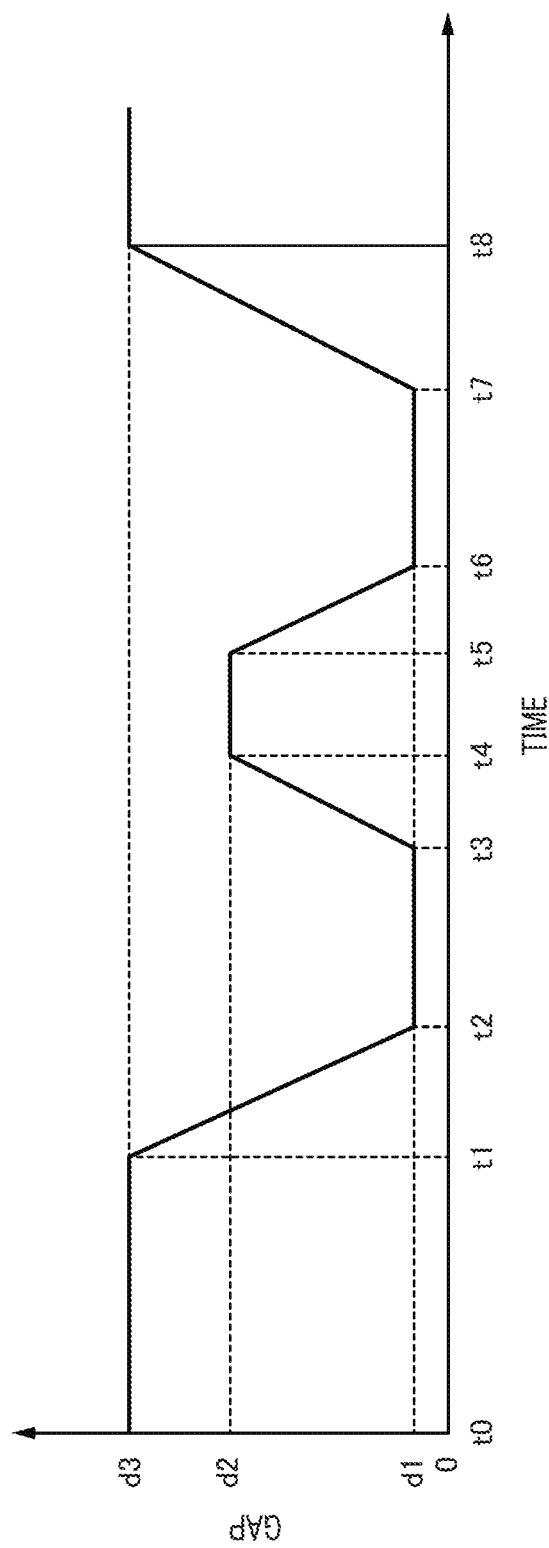
FIG. 10 is a view for explaining a state of a change in distance between a mold and a substrate.

FIG. 10 is a diagram for explaining a state of a change in distance d between the mold 1 and the substrate 2. FIG. 10 is a graph in which a horizontal axis illustrates time and a vertical axis illustrates a distance d between the mold 1 and the substrate 2. Time t0 is a start time of Step S12 in FIG. 2. Time t1 is a start time of Step S13. Time t2 is a time at which the imprint operation of Step S13 is completed and time t3 is a time at which the exposure operation of Step S13 ends. Time t4 is a time at which the mold releasing of Step S13 is completed, which is also a start time of Step S14. Time t5 is a start time of Step S15. Time t6 is a time at which the imprint operation of Step S15, time t7 is a time at which the exposure operation of Step S15 ends, and time t8 is a time at which the release mold operation of Step S15 is completed. It should be noted that the distance d between the mold 1 and the substrate 2, which will be described below, is changed by controlling the mold positioning unit 3 or the substrate positioning unit 4 using the controller 8.

In Step S12, as illustrated in FIG. 3A, a gas is supplied between the mold 1 and the substrate 2 while moving the substrate 2. At that time (times t0 to t1), the distance d between the mold 1 and the substrate 2 needs to be a distance so that a gas easily enters between the mold 1 and the substrate 2. Thus, the distance d is set as the first gap d3.

Subsequently, the mold 1 is brought into contact with the imprint material on the substrate 2 in the imprint operation (times t1 to t2). Thus, the distance between the mold 1 and the substrate 2 decreases and finally reaches the contact gap d1. Subsequently, both of the mold 1 and the substrate 2 are in a stationary state in the exposure operation (times t2 to t3). Thus, the distance is maintained at the contact gap d1.

Subsequently, the mold 1 and the imprint material on the substrate 2 are separated from each other in the release mold operation (times t3 to t4). Thus, the distance d changes in a direction in which the mold 1 and the imprint material on the substrate 2 are away from each other and increases to a maximum value d2 of the second gap. At that time, the maximum value d2 of the second gap is less than the first gap d3. As illustrated in FIG. 5A described above, as the mold 1 is pulled up, air flows into the second gap from the vicinity of the mold 1. It is necessary to minimize this inflow amount. For this reason, as described above, although the distance d may temporarily exceed the first gap due to a mold releasing force for performing the release mold operation at that time, it is desirable that the distance d at the time of completion of the release mold operation be small and it is desirable that the distance d at the time of completion of the release mold operation do not exceed the maximum value d2 of the second gap.

Subsequently, in the movement operation (times t4 to t5) of moving the substrate from the first shot region to the second shot region, the second gap is constant at the maximum value d2. At that time, the maximum value d2 of the second gap is less than the first gap d3. Assuming that the second gap exceeds the maximum value d2 in a period from times t4 to t5, the gas region GR in FIG. 6A is smaller when viewed in the XY plane direction. As a result, in the state of FIG. 6A, the pattern region PR of the mold 1 is not filled with the gas region GR and a defective product can occur due to an insufficient concentration of a gas. It should be noted that, since it is necessary that the second gap does not exceed the maximum value d2 in this process, the second gap may not be kept constant. That is to say, the second gap may be maintained to be equal to or less than the maximum value d2.

Since the mold 1 is brought into contact with the imprint material on the substrate 2 in the next imprint operation (times t5 to t6), the distance d decreases and finally reaches the contact gap d1. Subsequently, both of the mold 1 and the substrate 2 are in a stationary state in the exposure operation (times t6 to t7). Thus, the distance d is maintained at the contact gap d1. Subsequently, the mold 1 and the imprint material on the substrate 2 are separated from each other in the release mold operation (times t7 to t8). Thus, the distance changes in a direction in which the mold 1 is away from the imprint material on the substrate 2 and increases to reach the first gap d3. When the next imprint process is performed on the second shot region, imprint material application and gas supply are performed again. Thus, it is necessary to increase the distance up to the first gap d3.

Figure 11A:
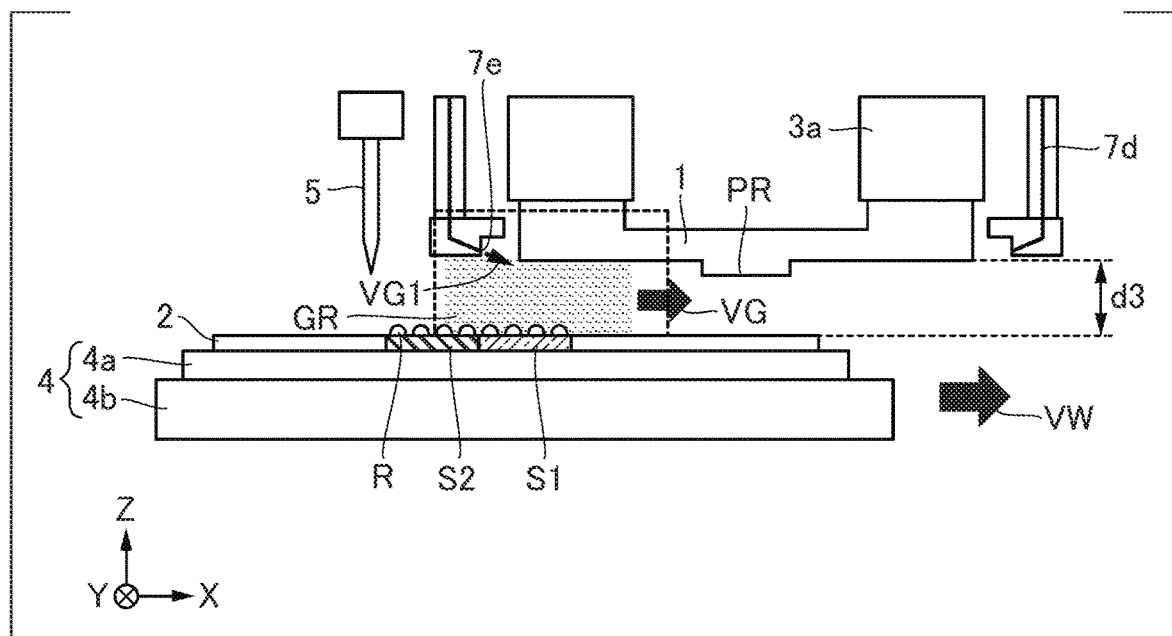
FIGS. 11A and 11B are views for explaining a first gap in a gas supply step of a first imprint process.
Figure 11B:
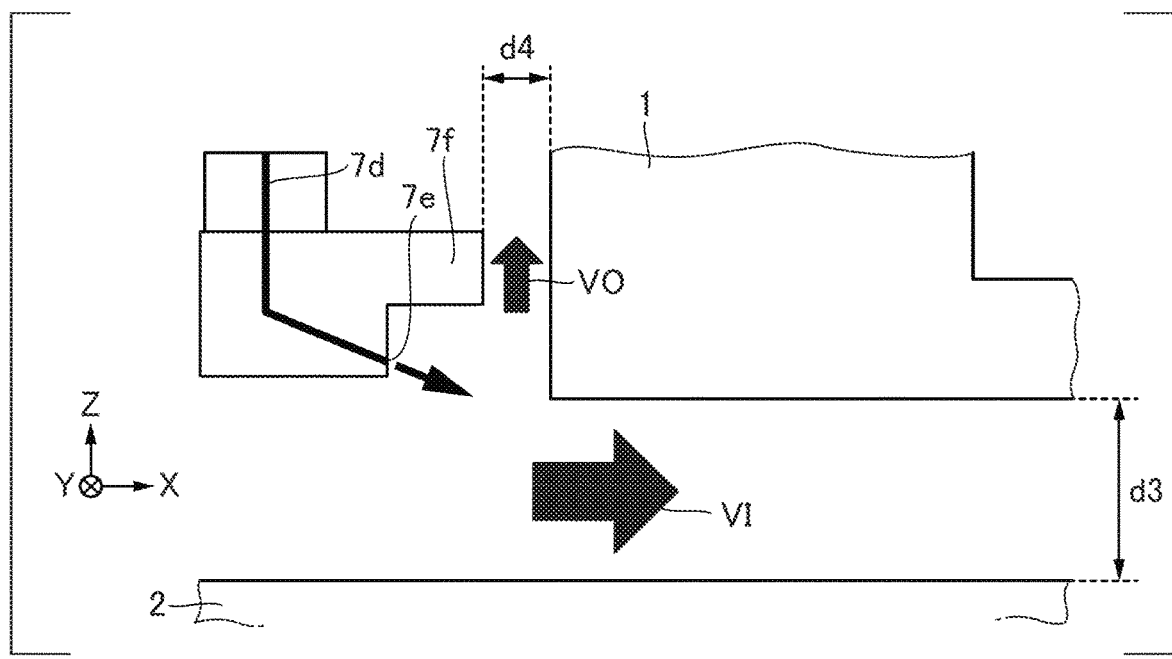

FIGS. 11A and 11B are diagrams for explaining the first gap d3 in the gas supply step of the first imprint process. FIG. 11A is an XZ cross-sectional view of the imprint apparatus 10 is a schematic diagram illustrating only the vicinity of the mold 1, the substrate 2, the mold positioning unit 3, the substrate positioning unit 4, the material supply unit 5, and the gas supply path 7d. FIG. 11B is an enlarged view of the dotted line portion of FIG. 11A, but the imprint material R and the gas region GR are omitted. A distance between a supply port portion 7f of the gas supply path 7d and a side surface of the mold 1 is defined as a gap d4. At the time of gas supply, the distance d between the mold 1 and the substrate 2 is the first gap d3. At that time, when the first gap d3 is larger than the gap d4, an amount of gas supplied through the gas supply path 7d flowing out in an arrow VO direction decreases and an amount of gas supplied through the gas supply path 7d flowing out in an arrow VI direction increases. Therefore, in order to efficiently supply a gas between the mold 1 and the substrate 2, it is desirable that the first gap d3 is larger than the gap d4.

Figure 12C:
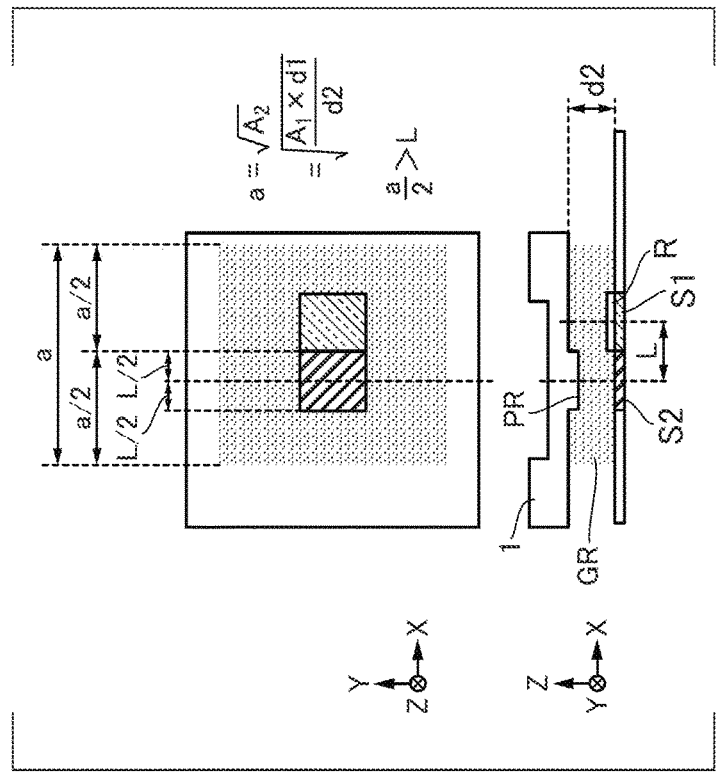
FIGS. 12A, 12B and 12C are views for explaining an example of a method for determining a maximum value of a second gap.
Figure 12A:
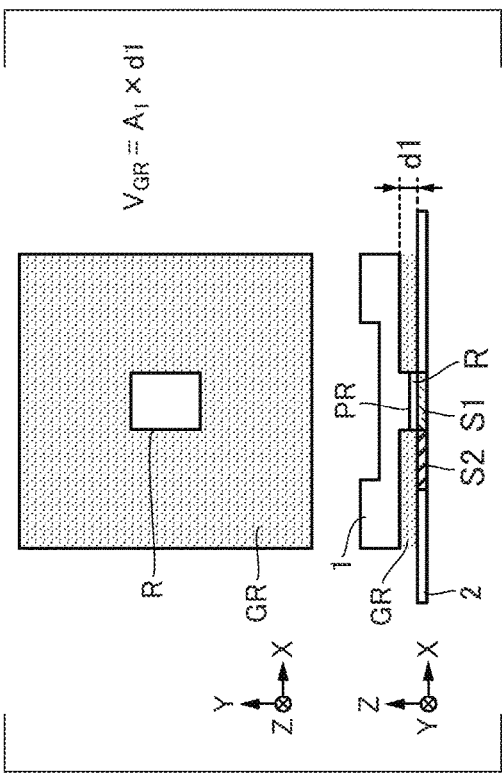
Figure 12B:
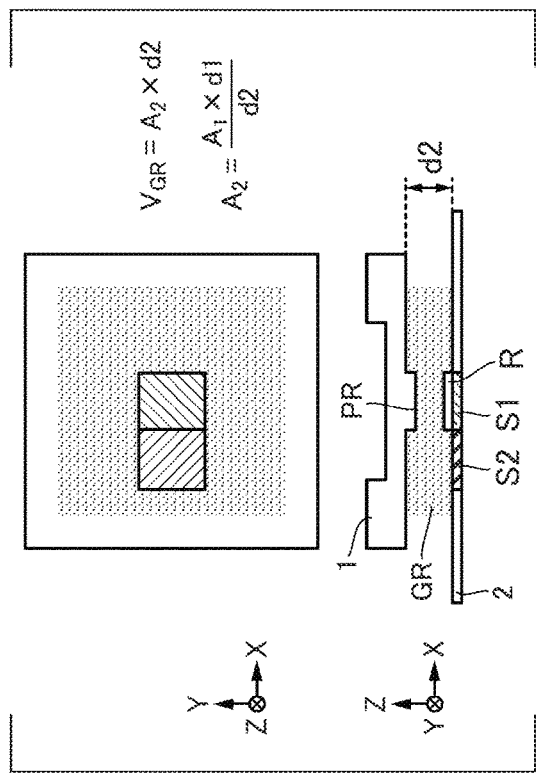

A method of determining the maximum value d2 of the second gap in the controller 8 will be described below. FIG. 12 is a diagram for explaining an example of the method of determining the maximum value d2 of the second gap. FIGS. 12A to 12C are schematic diagrams illustrating the mold 1, the substrate 2, and the space between the mold 1 and the substrate 2, an upper diagram is a cross-sectional view of the XY plane, and a lower diagram is a cross-sectional view of the XZ plane.

FIG. 12A illustrates a state at the time of completion of the imprint operation in Step S13. As described above, the space between the mold 1 and the substrate 2 is the gas region GR. In the XY plan view, the imprint material R is in the pattern region PR portion of the mold 1 and the other region is the gas region GR. Assuming that a volume of the gas region GR at that time is $V_{GR}$, as illustrated in FIG. 12A, the volume of the gas region GR is expressed by the following Expression.

$$V_{GR} = A_1 \times d1 \qquad \text{[Math. 1]}$$

$A_1$ is an area excluding the pattern region PR of the mold 1 and a contact gap d1 is a distance d between the mold 1 and the substrate 2 after the imprinting. As described above, the contact gap d1 is a sum of a thickness of a convex portion of the pattern region PR (several tens μm to several hundred μm) and a thickness of the imprint material. It should be noted that, since the contact gap d1 is substantially the same as a height of the convex portion provided in the pattern region PR portion of the mold 1, calculation may be performed by replacing the contact gap d1 with the height.

FIG. 12B illustrates a state at the time of completion of the release mold operation in Step S13. As described above, when a gas enters between the mold 1 and the substrate 2 from the vicinity of the mold 1 in accordance with the operation of pulling up the mold 1, the gas region GR has a small area when viewed in the XY plane direction. The volume $V_{GR}$ of the gas region at that time is a product of an area $A_2$ of the gas region GR in the XY plane direction and the maximum value d2 of the second gap. Assuming that a volume $V_{GR}$ of the gas region GR of the gas region GR does not change before and after the release mold operation even when a gas flows in, the area $A_2$ of the gas region GR at that time is expressed by following mathematical expression as illustrated in the following expression of FIG. 12B.

$$A_2 = \frac{A_1 \times d1}{d2} \qquad \text{[Math. 2]}$$

FIG. 12B illustrates a state before performing the imprint operation in Step S13. A relative movement distance between the mold 1 and the substrate 2 in the surface direction from the first shot region to the second shot region is set as L. It should be noted that L may be a width of the pattern region PR. As described above, the substrate 2 moves so that the second shot region S2 is disposed below the pattern region PR of the mold 1. The gas region GR also moves as the substrate 2 moves. Since the gas region GR moves at a speed which is half a moving speed of the substrate 2, a movement distance is halved. Therefore, the gas region moves L/2. At that time, it is desirable that a lower side of the pattern region PR is filled with the gas region GR. A mathematical expression when expressing a width a of the gas region GR by areas $A_1$ and $A_2$ of the gas region GR and a maximum value d2 of a contact gap d1 and a second gap is as illustrated in FIG. 12C and can be expressed by the following mathematical expression.

$$\alpha = \sqrt{A_2} \qquad \text{[Math. 3]}$$
$$= \sqrt{\frac{A_1 \times d1}{d2}}$$

At that time, a condition in which the width a of the gas region GR is a/2>L. The controller 8 determines the maximum value d2 by calculating the maximum value d2 of the second gap which satisfies this condition. By keeping the second gap not more than the calculated maximum value d, it is possible to minimize a decrease in the concentration of the gas between the pattern region PR and the imprint material at the time of the second contact without supplying the gas after the first contact. As a result, even when the second contact is performed without supplying the gas after the first contact, the occurrence of defects due to an insufficient concentration of the gas can be minimized.

Although the imprint apparatus including the material supply unit 5 has been described above, the present invention can be adopted irrespective of the presence or absence of the material supply unit. For example, an imprint material may be applied to one surface of a substrate using an external coating apparatus and then loaded into the imprint apparatus. In this case, Step S11 in FIG. 2 can be omitted. Here, also in this case, it is necessary to supply a gas and a gas is supplied every time a plurality of contacts are made by adjusting the distance d between the mold 1 and the substrate 2 using the above-described method and apparatus. At that time, the number of contacts for gas supply may be set in advance. In this case, although the number of contacts differs in accordance with a size of the shot region and an amount of gas to be supplied, it is desirable that the number of contacts set in advance is three or less. At the time of supplying a gas, the method of supplying the gas using the Couetter flow described using FIG. 9 can be used. In this case as well, similarly, the substrate 2 is moved to a position of the supply port 7e of the gas supply path 7d and a gas is supplied while moving to dispose a target shot region again below the pattern region PR of the mold 1.

Also, although the release mold operation and the movement operation are performed as different steps in this embodiment, the release mold operation and the movement operation may be performed at the same time. In this case, the controller 8 controls the mold positioning unit 3 or the substrate positioning unit 4 so that the distance d in a period until a second contact after a first contact is smaller than the first gap (is not the first gap or more).

As described above, by controlling the distance d between the mold 1 and the substrate 2, the imprint apparatus in the first embodiment can efficiently supply a gas between the mold 1 and the substrate 2 and need not to perform gas supply for each contact. Thus, it is possible to reduce an amount of consumption of gas. Furthermore, since a gas supply time is reduced, it is also possible to improve the productivity.

Second Embodiment

An imprint apparatus 10 according to a second embodiment of the present invention will be described below. The matters which are not mentioned in the second embodiment are the same as the first embodiment. In the second embodiment, the controller 8 supplies a gas again if a predetermined condition is satisfied, such as if a distance d exceeds a set threshold value due to some causes during a mold release operation.

Figure 13:
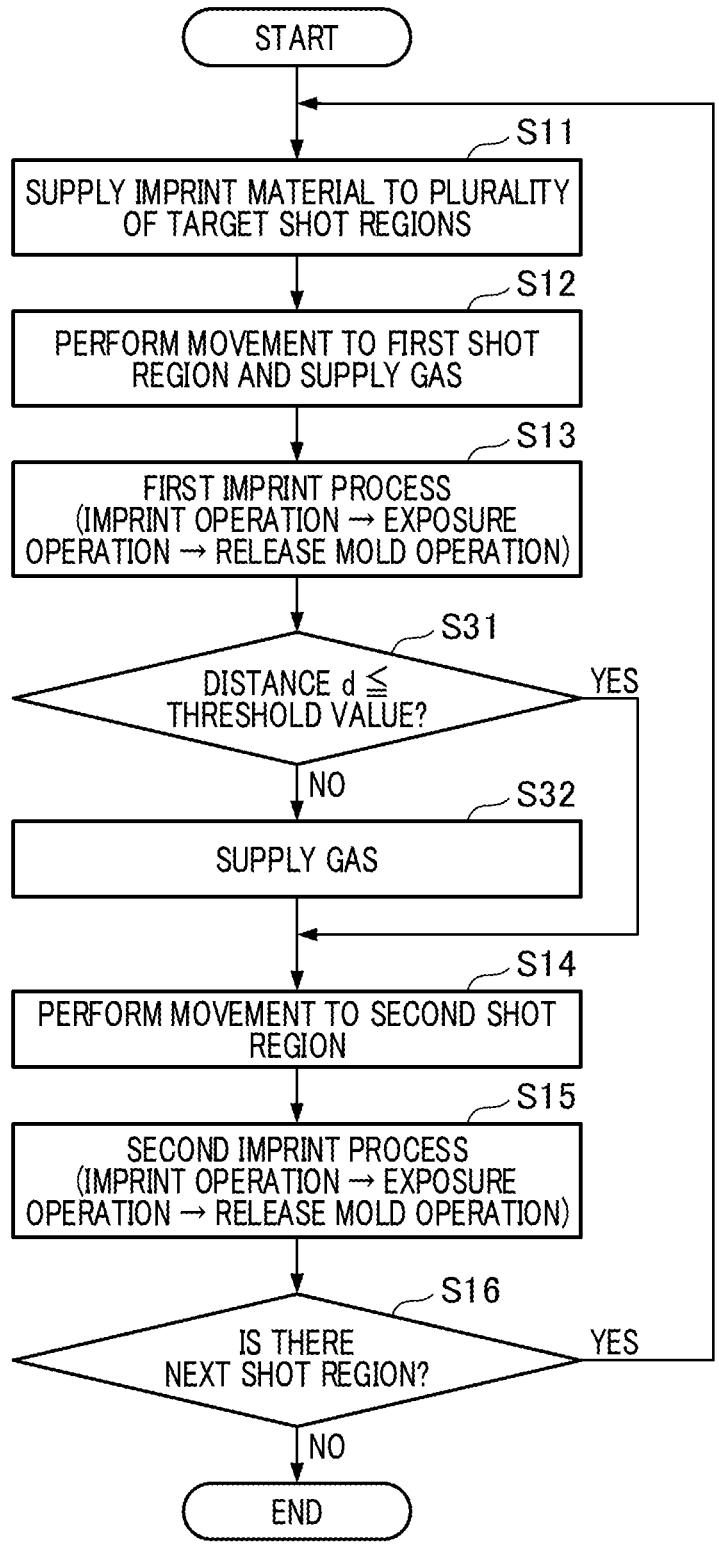
FIG. 13 is a flowchart for describing an imprint process of an imprint apparatus according to a second embodiment.

FIG. 13 is a flowchart for describing an imprint process of an imprint apparatus 10 according to the second embodiment. Steps S11 to S13 in FIG. 13 are the same as those in the first embodiment and description thereof will be omitted.

In Step S31, after completion of the release mold operation, the distance d is compared with a predetermined threshold value. The predetermined threshold value is equivalent to, for example, the maximum value d2 of the second gap in the first embodiment, which can be preset by the calculation method described in the first embodiment. When the distance d exceeds the threshold value after a mold comes into contact with a first shot region, there is a concern concerning an insufficient gas concentration at the time of an imprint operation for a second shot region. If the distance d exceeds the threshold value after the mold comes into contact with the first shot region, the process proceeds to a process of Step S32 and if the distance d does not exceed the threshold value, the process proceeds to the process of Step S14.

In Step S32, a gas is supplied. Step S32 is a step performed only when the distance d exceeds the threshold value after the mold comes into contact with the first shot region. If the distance d exceeds the set threshold value after the mold comes into contact with the first shot region, there is a concern concerning an insufficient gas concentration in a pattern region PR portion of a mold 1 at the time of imprinting of the second shot region. Thus, a gas is supplied through a gas supply path 7d again to increase a gas concentration below a pattern region of the mold 1. Since the gas is supplied again, an amount of gas consumption is likely to increase and productivity per hour is likely to decrease, but it is possible to reduce the incidence of defective products due to an insufficient gas concentration. It should be noted that, although a gas is supplied again if the distance d exceeds the threshold value after the mold comes into contact with the first shot region in this embodiment, a predetermined threshold value and the second gap may be compared during a movement operation to a second region. In this case, if the second gap exceeds the threshold value, a gas is supplied again.

Since Steps S14 to S16 in FIG. 13 are the same as those in the first embodiment, description thereof will be omitted. As described above, in the imprint apparatus according to the second embodiment, if the second gap exceeds the threshold value, gas supply is performed again to prevent an insufficient concentration of a gas and it is possible to reduce the occurrence rate of defects. It should be noted that, although a gas is supplied again if the second gap exceeds the maximum value d2 in this embodiment, the present invention is not limited thereto. For example, a gas may be supplied again, for example, if it is determined that a gas concentration in a space between the mold 1 and a substrate 2 has fallen below a predetermined threshold value and the like.

Embodiment of Article Manufacturing Method

A method for manufacturing an article according an embodiment of the present invention is appropriate for, for example, manufacturing an article such as a micro-apparatus such as a semiconductor apparatus and an element having a fine structure. The method for manufacturing an article according to this embodiment includes a step of forming a pattern on an imprint material applied on a substrate using the imprint apparatus (a step of imprinting the substrate) and a step of processing the substrate having the pattern formed thereon in such a step. In addition, such a manufacturing method includes other well-known steps (oxidation, film formation, evaporation, doping, planarization, etching, resist peeling, dicing, bonding, packaging, and the like). The method for manufacturing an article according to this embodiment is advantageous in at least one of performance, quality, productivity, and production cost of the article, as compared with the conventional method.

The pattern of the cured product formed using the imprint apparatus 10 is used permanently for at least a part of various articles or temporarily for manufacturing various articles. The article is an electric circuit element, an optical element, an MEMS, a recording element, a sensor, a mold, or the like. Examples of the electric circuit elements include volatile or nonvolatile semiconductor memories such as a DRAM, an SRAM, a flash memory, and an MRAM and a semiconductor element such as an LSI, a CCD, an image sensor, and an FPGA. Examples of the mold include an imprinting mold and the like.

The pattern of the cured product is used as it is as a constituent member of at least a part of the above-described article or is temporarily used as a resist mask. After etching, ion implantation, or the like is performed in the processing step of the substrate, the resist mask is removed.

Figure 14A:
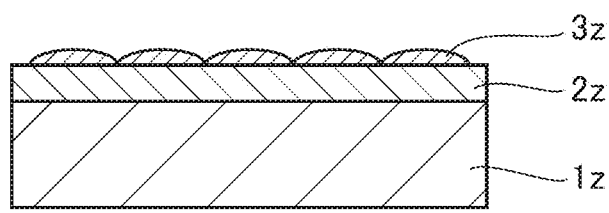
FIGS. 14A, 14B, 14C, 14D, 14E, and 14F are views illustrating a method for manufacturing an article.

A specific method for manufacturing an article will be described below. As illustrated in FIG. 14A, a substrate 1z such as a silicon wafer whose surface having a workpiece 2z such as an insulator formed thereon is prepared and then imprint materials 3z are applied onto a surface of the workpiece 2z using an inkjet method or the like. Here, a state in which the plurality of droplet-shaped imprint materials 3z are applied onto a substrate.

Figure 14B:
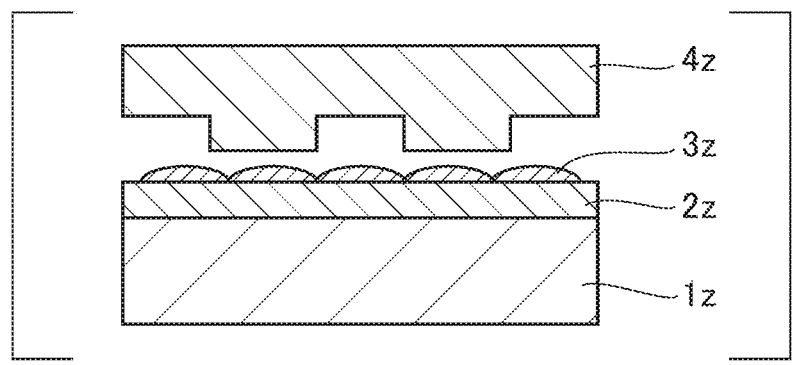
Figure 14C:
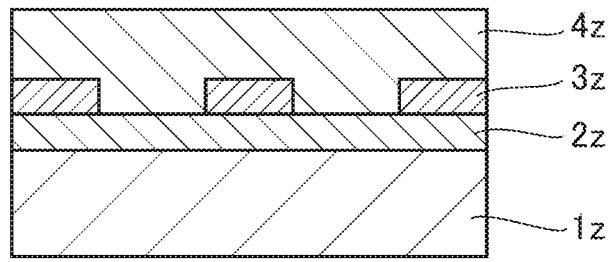

As illustrated in FIG. 14B, an imprinting mold 4z faces to directed to the imprint material 3z on the substrate with a side thereof on which a concave and convex pattern is formed. As illustrated in FIG. 14C, the substrate 1z to which the imprint material 3z is applied is brought into contact with a mold 4z and subjected to applied pressure. A gap between the mold 4z and the workpiece 2z is filled with the imprint material 3z. In this state, when light is radiated as curing energy through the mold 4z, the imprint material 3z is cured.

Figure 14D:
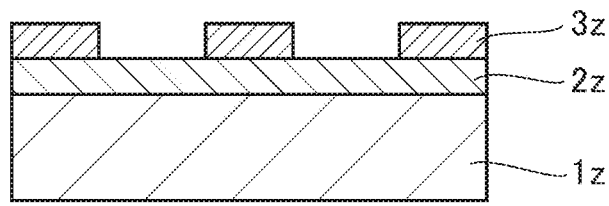

As illustrated in FIG. 14D, after curing the imprint material 3z, when the mold 4z and the substrate 1z are pulled apart, a pattern of the cured product of the imprint material 3z is formed on the substrate 1z. The pattern of the cured product is configured so that a concave of the mold corresponds to a convex portion of the cured product and the concave portion of the mold corresponds to the convex portion of the cured product, that is, the concave-convex pattern of the mold 4z is transferred to the imprint material 3z.

Figure 14E:
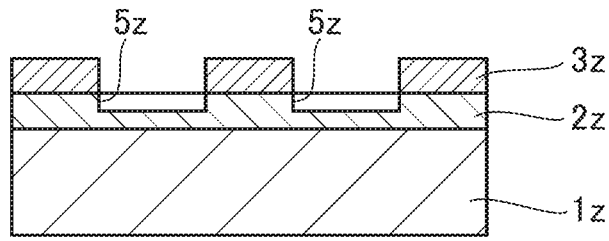
Figure 14F:
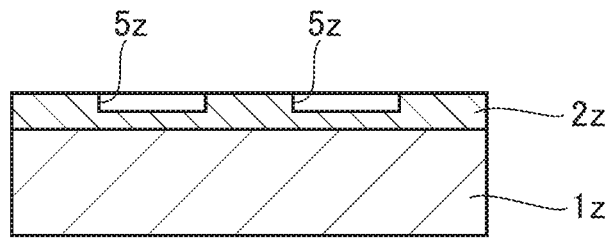

As illustrated in FIG. 14E, when etching is performed using the pattern of the cured product as an etching-resist mask, a portion of a surface of the workpiece 2z which is not cured or remains thin is removed and a groove 5z is formed. As illustrated in FIG. 14F, when the pattern of the cured product is removed, an article having a groove 5z formed in the surface of the workpiece 2z can be obtained. Here, the pattern of the cured product is removed, but the pattern of the cured product may be used a film for an interlayer insulation contained in, for example, a semiconductor element, that is, as a constituent member of the article without being removed after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-078578, filed Apr. 16, 2018, which is hereby incorporated by reference wherein in its entirety.

What is claimed is:

1. An apparatus for bringing a mold into contact with a material supplied onto a plurality of shot regions formed on a substrate for each of the plurality of shot regions and curing the material, comprising:
a gas supply unit configured to supply a gas to a space between the mold and the substrate;
a positioning unit configured to change a relative position between the mold and the substrate; and
a controller configured to control the gas supply unit and the positioning unit,
wherein the controller causes second contact between a material supplied onto a second shot region different from a first shot region and the mold after first contact between a material supplied onto the first shot region having the material supplied thereon among the plurality of shot regions and the mold and controls the positioning unit so that a second gap between the mold and the substrate in a first direction perpendicular to a surface of the substrate at a time when a relative position between the mold and the substrate in a second direction along the surface of the substrate is changed so that the second shot region is disposed below the mold after the first contact is shorter than a first gap between the mold and the substrate in the first direction at a time when supplying the gas.

2. The apparatus according to claim 1, wherein the controller controls the positioning unit so that the second gap in a period up to the second contact after the first contact is smaller than the first gap.

3. The apparatus according to claim 1, wherein the controller controls the gas supply unit such that a gas is supplied to the space before the first contact.

4. The apparatus according to claim 1, wherein the controller determines a maximum value of the second gap and maintains the second gap at the maximum value or less.

5. The apparatus according to claim 4, wherein the controller determines the maximum value on the basis of a volume of the space when the material comes into contact with the mold and a movement distance of the mold or the substrate in the second direction at the time of the change.

6. The apparatus according to claim 1, wherein the first gap is larger than a gap between the mold and the gas supply unit.

7. The apparatus according to claim 1, wherein the controller controls the gas supply unit to supply the gas for each of the plurality of contacts including the first contact and the second contact.

8. The apparatus according to claim 7, wherein the controller controls the gas supply unit to supply the gas to the space also before the second contact or before a third contact between a material supplied onto a shot region different from the first and second shot regions and the mold among the plurality of contacts if a predetermined condition is satisfied.

9. The apparatus according to claim 8, wherein the controller controls the gas supply unit to supply the gas to the space also before the second contact or the third contact if the second gap exceeds a predetermined maximum value.

10. The apparatus according to claim 8, wherein, in a period up to the second contact after the first contact,
if the gap between the mold and the substrate exceeds a predetermined maximum value, the controller controls the gas supply unit to supply the gas to the space also before the second contact or before the third contact.

11. The apparatus according to claim 8, wherein the number of the plurality of contacts is three or less.

12. The apparatus according to claim 7, wherein the plurality of contacts are performed on neighboring shot regions.

13. A method for bringing a mold into contact with a material supplied onto a plurality of shot regions formed on a substrate for each of the plurality of shot regions and curing the material, comprising:
supplying a gas to a space between the mold and the substrate; and
performing second contact between a material supplied onto a second shot region different from a first shot region and the mold after first contact between a material supplied onto the first shot region having the material supplied thereon among the plurality of shot regions and the mold and making shorter a second gap between the mold and the substrate in a first direction perpendicular to a surface of the substrate at a time when a relative position between the mold and the substrate in a second direction along the surface of the substrate is changed so that the second shot region is disposed below the mold after the first contact than a first gap between the mold and the substrate in the first direction at a time when supplying the gas.

14. A method for manufacturing an article, comprising:
bringing a mold into contact with a material supplied onto a plurality of shot regions formed on a substrate and forming a pattern on the substrate using an apparatus; and
processing the substrate having the pattern formed in the step,
wherein the apparatus includes:
a gas supply unit configured to supply a gas to a space between the mold and the substrate;
a positioning unit configured to change a relative position between the mold and the substrate; and
a controller configured to control the gas supply unit and the positioning unit, and
the controller causes second contact between a material supplied onto a second shot region different from a first shot region and the mold after first contact between a material supplied onto the first shot region having the imprint material supplied thereon among the plurality of shot regions and the mold and controls the positioning unit so that a second gap between the mold and the substrate in a first direction perpendicular to a surface of the substrate at a time when a relative position between the mold and the substrate in a second direction along the surface of the substrate is changed so that the second shot region is disposed below the mold after the first contact is shorter than a first gap between the mold and the substrate in the first direction at a time when supplying the gas.

* * * * *